(12) United States Patent
Miyazaki et al.

(10) Patent No.: US 7,692,973 B2
(45) Date of Patent: Apr. 6, 2010

(54) SEMICONDUCTOR DEVICE

(75) Inventors: Aya Miyazaki, Kanagawa (JP);
Mitsuaki Osame, Kanagawa (JP);
Hiroyuki Miyake, Kanagawa (JP);
Shunpei Yamazaki, Tokyo (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 247 days.

(21) Appl. No.: 11/727,209

(22) Filed: Mar. 23, 2007

(65) Prior Publication Data

US 2008/0029807 A1    Feb. 7, 2008

(30) Foreign Application Priority Data

Mar. 31, 2006   (JP) .............. 2006-101265

(51) Int. Cl.
*G11C 11/03* (2006.01)
(52) U.S. Cl. .............. 365/185.33; 365/185.14; 365/185.17; 365/185.29
(58) Field of Classification Search ............ 365/185.33, 365/185.14, 185.17, 185.29
See application file for complete search history.

(56) References Cited

U.S. PATENT DOCUMENTS

| | | | |
|---|---|---|---|
| 5,428,578 A | 6/1995 | Kaya et al. | |
| 5,467,306 A | 11/1995 | Kaya et al. | |
| 5,526,315 A | 6/1996 | Kaya et al. | |
| 5,596,528 A | 1/1997 | Kaya et al. | |
| 5,734,609 A * | 3/1998 | Choi et al. | 365/185.17 |
| 5,798,547 A * | 8/1998 | Urai | 257/316 |
| 5,801,579 A | 9/1998 | Le et al. | |
| 5,815,435 A | 9/1998 | Van Tran | |
| 5,852,576 A | 12/1998 | Le et al. | |
| 5,888,868 A | 3/1999 | Yamazaki et al. | |
| 6,134,146 A | 10/2000 | Bill et al. | |
| 6,198,125 B1 | 3/2001 | Yamazaki et al. | |
| 6,417,538 B1 | 7/2002 | Choi | |
| 6,448,135 B1 | 9/2002 | Yamazaki et al. | |
| 6,556,475 B2 | 4/2003 | Yamazaki et al. | |
| 6,646,922 B2 | 11/2003 | Kato | |
| 6,687,161 B2 | 2/2004 | Marotta et al. | |
| 6,697,283 B2 | 2/2004 | Marotta et al. | |
| 6,734,492 B2 | 5/2004 | Yamazaki et al. | |
| 6,768,680 B2 | 7/2004 | Kato | |
| 6,813,190 B2 | 11/2004 | Marotta et al. | |
| 6,822,904 B2 | 11/2004 | Gallo et al. | |
| 6,907,497 B2 * | 6/2005 | Hosono et al. | 711/103 |
| 6,937,513 B1 | 8/2005 | Desai et al. | |
| 6,996,003 B2 | 2/2006 | Li et al. | |
| 6,996,011 B2 | 2/2006 | Yeh et al. | |
| 7,095,656 B2 | 8/2006 | Lee | |

(Continued)

FOREIGN PATENT DOCUMENTS

JP    2000-058685    2/2000

*Primary Examiner*—Pho M. Luu
(74) *Attorney, Agent, or Firm*—Eric J. Robinson; Robinson Intellectual Property Law Office, P.C.

(57) ABSTRACT

A semiconductor device is provided, which comprises at least a cell including a plurality of memory elements connected in series. Each of the plurality of memory elements includes a channel formation region, source and drain regions, a floating gate, and a control gate. Each of the source and drain regions is electrically connected to an erasing line through a semiconductor impurity region.

34 Claims, 22 Drawing Sheets

U.S. PATENT DOCUMENTS

| | | |
|---|---|---|
| 7,200,041 B2 | 4/2007 | Marotta et al. |
| 7,206,240 B2 | 4/2007 | Gallo et al. |
| 7,233,522 B2 * | 6/2007 | Chen et al. ............. 365/185.02 |
| 7,323,924 B2 | 1/2008 | Osame et al. |
| 7,324,123 B2 | 1/2008 | Yamazaki et al. |
| 7,403,423 B2 | 7/2008 | Marotta et al. |
| 7,529,125 B2 | 5/2009 | Ohshima |
| 7,554,854 B2 | 6/2009 | Osame et al. |
| 7,595,778 B2 | 9/2009 | Osame et al. |
| 2004/0256996 A1 | 12/2004 | Osame et al. |
| 2005/0205880 A1 | 9/2005 | Anzai et al. |
| 2006/0097250 A1 | 5/2006 | Koyama et al. |
| 2006/0273999 A1 | 12/2006 | Yamazaki et al. |
| 2009/0257283 A1 | 10/2009 | Osame et al. |

* cited by examiner

SEMICONDUCTOR DEVICE

BACKGROUND OF THE PRESENT INVENTION

1. Field of the Present Invention

The present invention relates to a semiconductor device provided with a memory unit capable of writing, reading and erasing data electrically, and a semiconductor device provided with a nonvolatile memory element as a memory unit.

2. Description of the Related Art

The market is expanding for nonvolatile memories in which data can be electrically rewritten and data can be stored even after a power source is turned off. A nonvolatile memory has a structure similar to that of a MOSFET (Metal Oxide Semiconductor Field Effect Transistor) and is provided with a region capable of accumulating charges for a long period of time over a channel formation region. The region capable of accumulating charges is also referred to as a floating gate since it is formed over an insulating layer to be isolated from the surroundings. Further, a control gate is provided over the floating gate with the insulating layer interposed therebetween.

A so-called floating gate type nonvolatile memory having such a structure accumulates charges in or discharges charges form a floating gate by a voltage applied to a control gate. In other words, charges are injected to or extracted from the floating gate by a high voltage applied between a semiconductor layer provided with a channel formation region and the control gate. It is said that a Fowler-Nordheim type (F-N type) tunneling current or a thermal electron flows through the insulating layer over the channel formation region at this time. Therefore, the insulating layer is also referred to as a tunnel insulating layer.

Further, a NOR type cell and a NAND type cell are given for a typical cell structure of the floating gate type nonvolatile memory. The NOR type cell has a structure in which one memory element is included in one cell. The NAND type cell has a structure in which a plurality of memory elements connected in series are included in one cell (see Patent Document 1).

A memory device using a nonvolatile memory element is formed applying LSI technology, and a memory array portion in which nonvolatile memory elements are arranged and a peripheral circuit for controlling operation of the memory array portion are formed over one silicon wafer. In erasing operation of a NAND cell, substrate potentials of the memory array portion are varied so that data is erased collectively. Therefore, in a case of employing the NAND cell, it is necessary not to affect the peripheral circuit. Thus, in the conventional LSI technology, it is required that a well (element region) formed over a wafer be separated for each of the memory array portion and the peripheral circuit.

[Patent Document 1] Japanese Published Patent Application No. 2000-058685

SUMMARY OF THE PRESENT INVENTION

In recent years, technology for forming a transistor on an insulating surface of glass, ceramic or the like (SOI technology) has been often used in accordance with significant development in thin film display devices and expansion of the market of portable information terminals. Further, system-on-panel technology by which a driver circuit and a memory are formed over the same substrate as the display device and the like has attracted attention.

A NAND memory formed by the conventional LSI technology extracts electrons accumulated in a floating gate by application of a positive potential to a substrate and sets a memory element in a negative state ("1"), in erase mode operation. However, a potential cannot be applied to a substrate having an insulating surface; therefore, the conventional NAND memory just having an SOI structure cannot perform erasing operation.

In view of the aforementioned problems, the present invention is provided as a result of committed studies of NAND memory cells capable of collective erasing even if formed on an insulating surface. Therefore, an object of the present invention is to provide a novel structure of a NAND cell which has an SOI structure and is capable of erasing data collectively. Further, another object of the present invention is to achieve large capacity and high integration of the NAND memory cell by application of an element separation technique of the SOI technology.

One aspect of the present invention is a semiconductor device including a NAND cell in which a plurality of memory elements each having a floating gate and a control gate are connected in series, word lines connected to control gates of the plurality of memory elements and an erasing line. In the aforementioned structure, terminals of the plurality of memory elements are diode-connected to the erasing line.

A feature of the present invention is that the terminals of the plurality of memory elements are diode-connected to the erasing line, whereby erasing operation can be performed.

In the aforementioned structure, a first selection transistor connected to one terminal of the NAND cell and a second selection transistor connected to the other terminal can be provided.

Another aspect of the present invention is that a NAND cell is provided on an insulating surface. Specifically, the semiconductor device has a structure described below. A channel formation region, a source region and a drain region of each of a plurality of memory elements included in the NAND cell are formed in an island-shaped semiconductor film on an insulating surface. In the semiconductor film, a diode connection to the source region and a diode connection to the drain region are formed, and the source region and the drain region of the memory element are electrically connected to the erasing line through the diode connections respectively. In the present invention, the island-shaped semiconductor film in which diode connections are formed can be a different film for each NAND cell. Alternatively, one film may be used for adjacent NAND cells.

The present invention includes a semiconductor film on an insulating surface, a first gate insulating film, n (n is an integer of two or more) floating gates over the semiconductor film with the first gate insulating film interposed therebetween, n control gates provided corresponding to the n floating gates, a second gate insulating film between the n floating gates and the n control gates, and an erasing line.

The semiconductor film of the aforementioned structure includes n channel formation regions provided corresponding to the n floating gates, (n+1) high concentration impurity regions corresponding to the n channel formation regions, and two low concentration impurity regions joined to the (n+1) high concentration impurity regions. Conductivity types of the (n+1) high concentration impurity regions and the two low concentration impurity regions are different, and the two low concentration impurity regions are electrically connected to the erasing line. Note that the number of low concentration impurity region formed in the semiconductor film may be one.

In the aforementioned structure, the high concentration impurity regions and the low concentration impurity regions form PN junctions in the semiconductor film. Therefore, each high concentration impurity region is connected to the erasing line through the PN junction, which realizes a NAND cell capable of erasing operation on the insulating surface.

A PIN junction diode may be formed instead of the aforementioned PN junction diode. High-resistance regions are further formed at junctions of the low concentration impurity regions and the (n+1) high concentration impurity regions. The high-resistance region is a region in which resistance is higher than in the low concentration impurity region. In the semiconductor film, the high concentration impurity regions, the high-resistance regions and the low concentration impurity regions form PIN junctions.

The NAND cell of the present invention is capable of erasing operation on the insulating surface with the memory element thereof connected to the erasing line through the PN junction or the PIN junction. Therefore, using a substrate having an insulating surface makes it easier to form a memory array portion and a peripheral circuit separately. Thus, the semiconductor device of the present invention becomes possible to be applied to a system-on-panel which is formed of a combination of the semiconductor device and a display portion and the like, for example.

Further, in the present invention, the diode junction is formed in the semiconductor film of the memory element of the NAND cell; therefore, higher integration can be achieved. Accordingly, memory capacity can be further increased.

DETAILED DESCRIPTION OF THE PRESENT INVENTION

Figure 1:
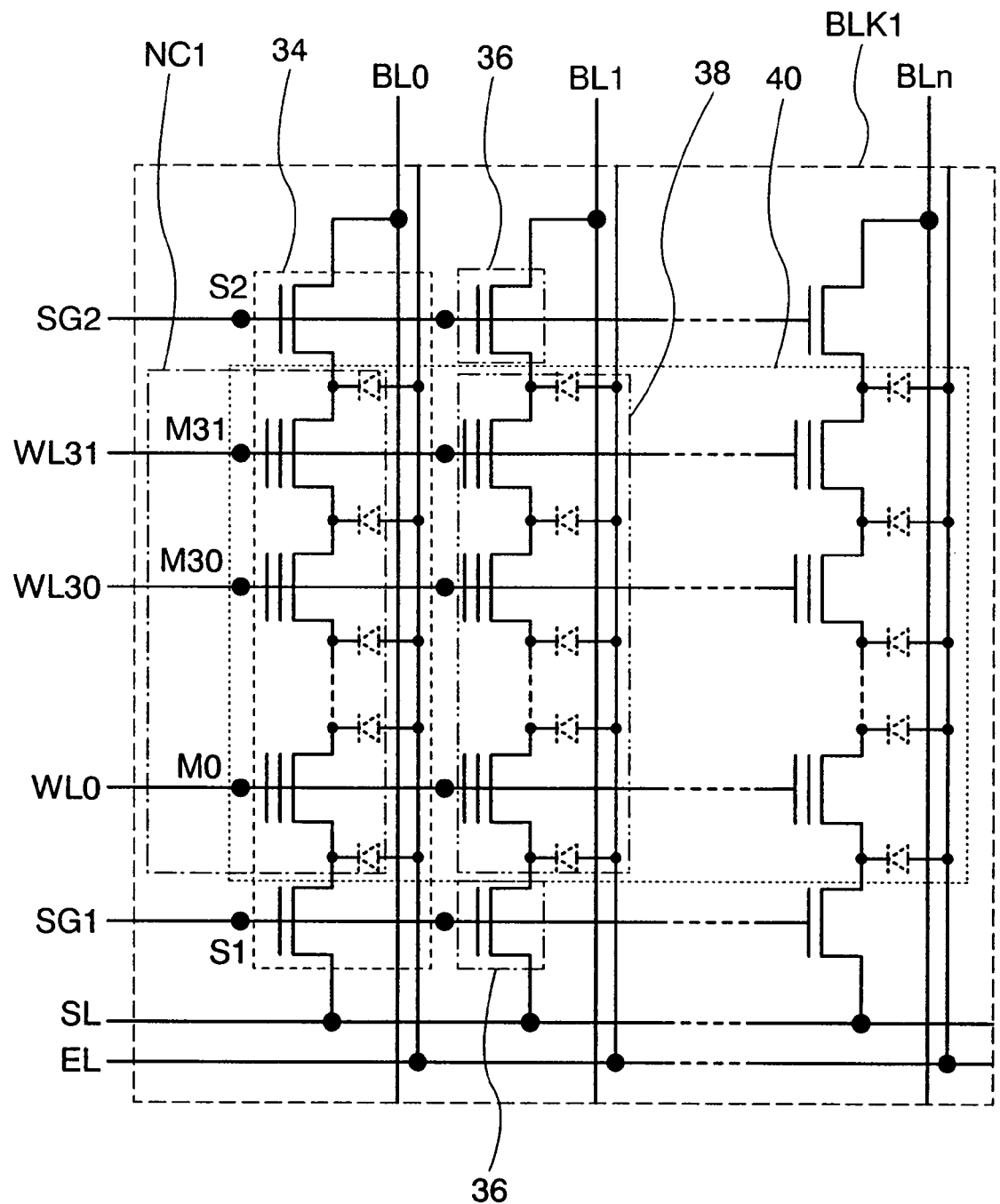
FIG. 1 is an equivalent circuit diagram of a NAND memory cell array of the present invention (Embodiment Mode 1).

Although the present invention will be fully described by way of embodiment modes with reference to the accompanying drawings, it is to be understood that various changes and modifications will be apparent to those skilled in the art. Therefore, unless such changes and modifications depart from the spirit and the scope of the present invention, they should be construed as being included therein. Note that common portions and portions having a similar function are denoted by the same reference numerals in all diagrams for describing embodiment modes, and description thereof is omitted.

Embodiment Mode 1

A memory array portion of the present invention includes a NAND memory cell array. FIG. 1 shows an equivalent circuit diagram of the NAND memory cell array of the present invention. A bit line BL (BL0 to BLn) is connected to a NAND cell NC1 in which a plurality of nonvolatile memory elements are connected in series. The nonvolatile memory element is an element that has a floating gate FG and a control gate CG.

A plurality of NAND cells collectively forms a block BLK. There are 32 word lines in a block BLK1 shown in FIG. 1. Here, the word lines are denoted by WL0 to WL31 respectively. Thus, each NAND cell includes 32 nonvolatile memory elements M0 to M31 corresponding to respective word lines, and the nonvolatile memory elements M0 to M31 are connected in series.

Control gates CGs of the nonvolatile memory elements M0 to M31 provided in the same row of the block BLK1 are connected to the word lines WL0 to WL31 corresponding to the row. The block BLK1 is provided with an erasing line EL, and each NAND cell is electrically connected to the erasing line EL. In each NAND cell, terminals of the nonvolatile memory elements M0 to M31 are diode-connected to the erasing line EL. In the figures, a diode connection is shown by diode elements of dotted lines. The erasing line is a wiring for performing erasing operation of the NAND cell. The erasing line EL is provided so that the NAND cell can be provided on the insulating surface and data can be erased collectively.

First, writing operation is described. Writing operation is performed after the condition that the NAND cell NC1 is in an erasing state, that is, threshold voltages of the nonvolatile memory elements M0 to M31 of the NAND cell NC1 are negative voltages. Writing is performed sequentially from the memory element M0 on a source line SL side. Writing to the memory element M0 as an example is outlined below.

Figure 2:
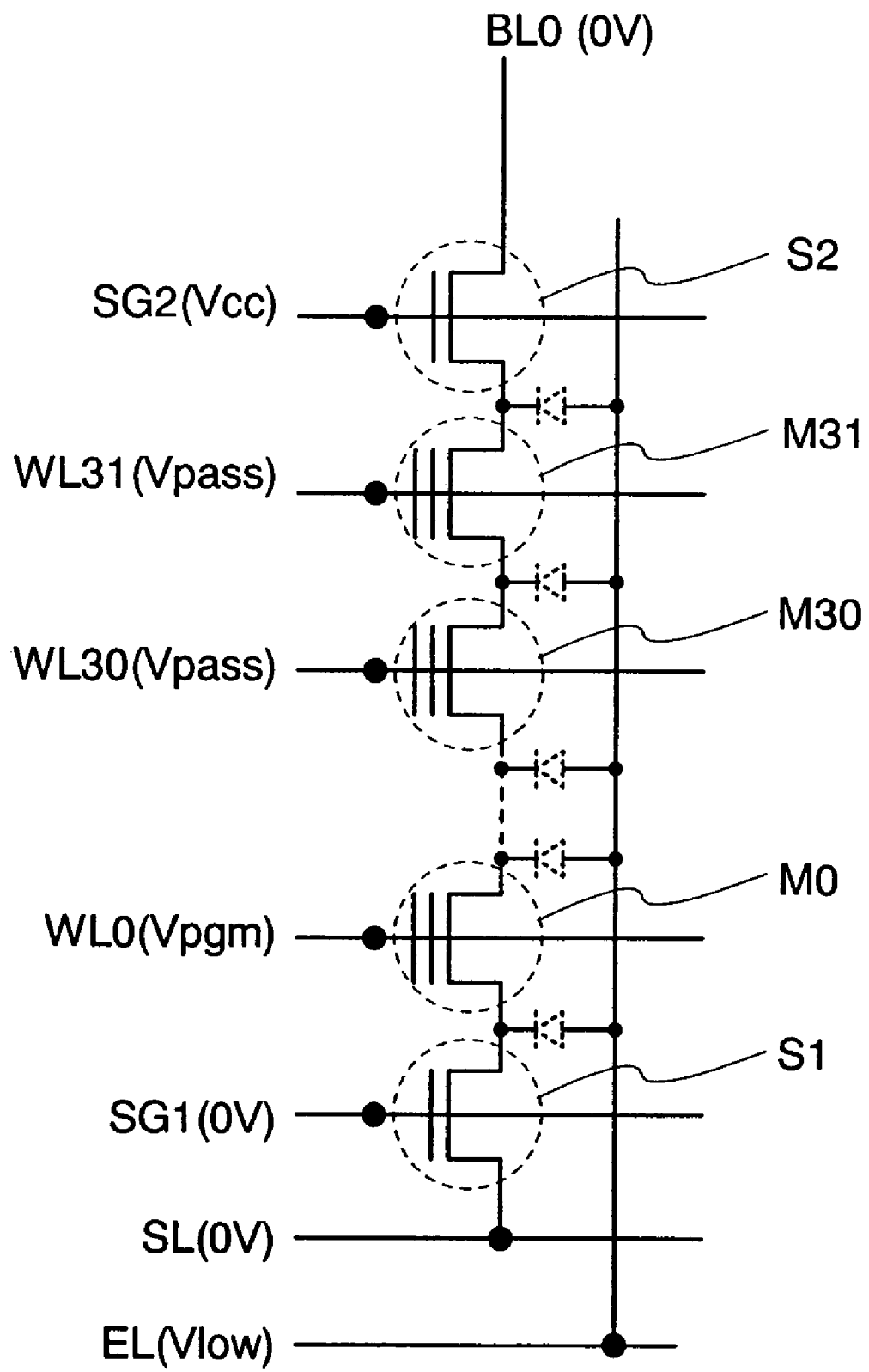
FIG. 2 is a diagram showing writing operation of a NAND memory cell array of the present invention (Embodiment Mode 1).

As shown in FIG. 2, in writing data, for example, Vcc (power source voltage) is applied to a selection gate line SG2 to turn on a selection transistor S2, and a potential of the bit line BL0 is set to 0 V (ground voltage). A potential of a selection gate line SG1 is set to 0 V so that a selection transistor S1 is off. Next, a potential of a word line WL0 of a memory element M0 is set to a high voltage Vpgm (approximately 20 V), and potentials of the other word lines are set to a medium voltage Vpass (approximately 10 V). Since the potential of the bit line BL0 is 0 V, a potential of a channel formation region of the selected memory element M0 is set to 0 V. A potential difference between the word line WL0 and the channel formation region is large; therefore, electrons are injected to a floating gate CG0 of the memory element M0 by the F-N tunneling current as described above. Accordingly, the threshold voltage of the memory element M0 is in a positive state (state where "0" is written), and the memory element to which data is not written maintains a negative state ("1"). At this time, a potential of the erasing line EL is set to the lowest voltage Vlow (here, 0 V), and thus a diode (a diode showing a diode connection) connected to each source electrode and each drain electrode of the memory element is in an off state.

Figure 3:
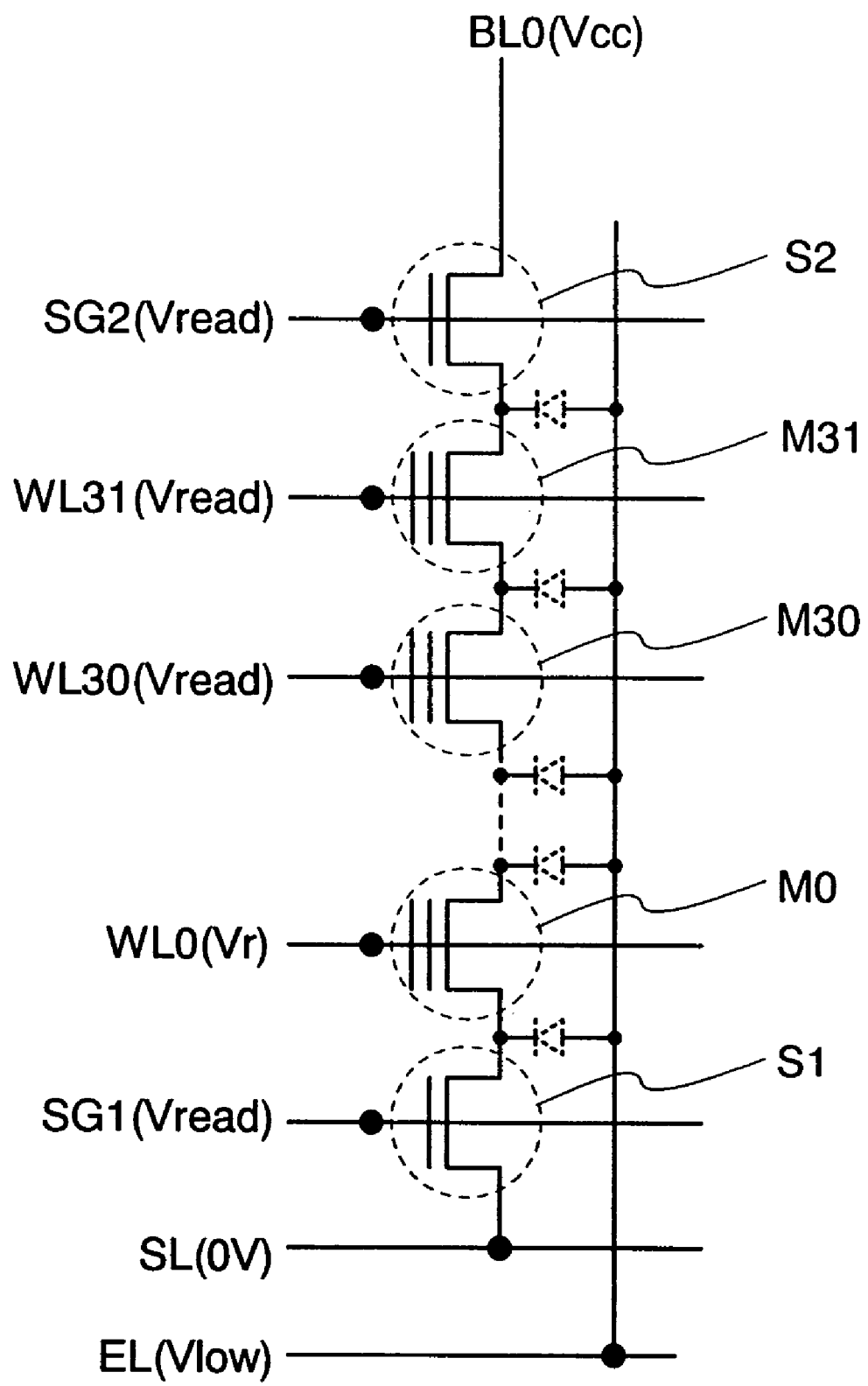
FIG. 3 is a diagram showing reading operation of a NAND memory cell array of the present invention (Embodiment Mode 1).

Next, reading operation is described. As shown in FIG. 3, reading operation is performed under the condition that a potential of the word line WL0 of the memory element M0 selected to be read is set to Vr (for example, 0 V), and potentials of the word lines WL1 to WL31 of memory cells which are not selected and the selection gate lines SG1 and SG2 are set to a reading medium voltage Vread slightly higher than a power source voltage. That is, the other memory element than those which are selected functions as a transfer transistor. Thus, whether a current flows to the memory element M0 selected to be read is determined. In other words, when data stored in the memory element M0 is "0", the memory element M0 is off so that the bit line BL0 does not discharge. Meanwhile, when the data is "1", the memory element M0 is on so that the bit line BL0 discharges. At this time, a potential of the erasing line EL is set to Vlow (here, 0 V) similarly to that in writing operation, and the diode is in an off state.

Figure 4:
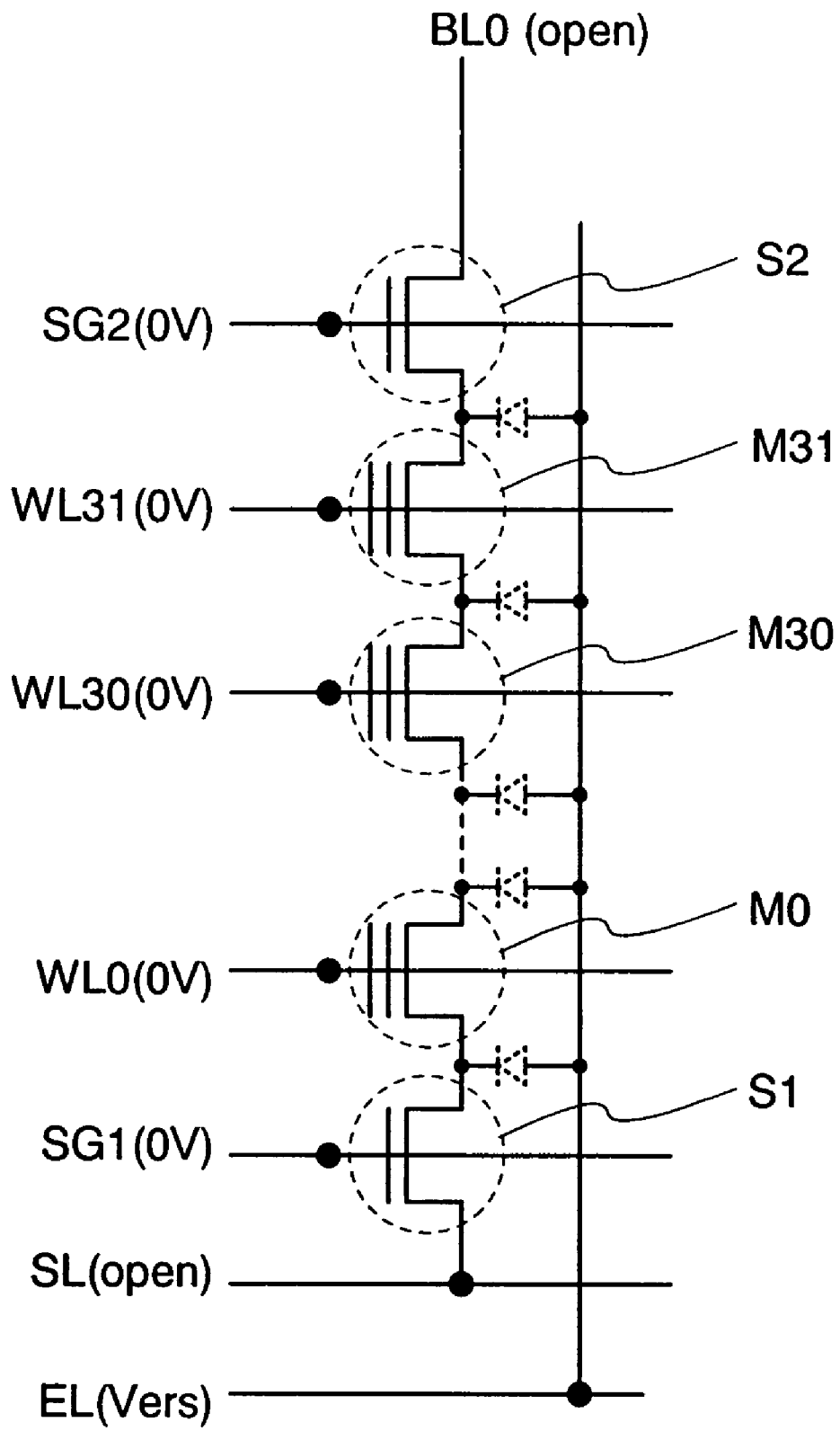
FIG. 4 is a diagram showing erasing operation of a NAND memory cell array of the present invention (Embodiment Mode 1).

Finally, erasing operation is described. As shown in FIG. 4, erasing operation is performed under the condition that potentials of the word lines WL0 to WL31 and the selection gate lines SG1 and SG2 are set to 0 V, and the bit line BL0 and the source line SL are in a floating state. Here, when a potential of the erasing line EL is set to Vers (for example, 20 V), the diode connected to each terminal (each source electrode and each drain electrode) of the nonvolatile memory element is turned on; a potential of each terminal becomes the potential Vers; electrons accumulated in the floating gate are extracted; and the memory elements M0 to M31 are in a negative state ("1"). By this method, collective erasing can be performed also in the NAND memory using the SOI technology.

Note that an equivalent circuit diagram of FIG. 1 shows a case where the source line SL is arranged in parallel with the word lines WL0 to WL31; however, the source line SL may be arranged in parallel with the bit line BL (BL0 to BL31). In that case, the NAND cell of one row is not connected to a source electrode or a drain electrode of the selection transistor S2, and the NAND cell of one column may be connected to a source electrode or a drain electrode of the selection transistor S2.

Further, in this specification, a case where electrons are extracted from a floating gate is referred to as an erase mode, and a case where electrons are injected into a floating gate is referred to as a write mode. Conversely, a case where electrons are injected into a floating gate may be an erase mode, and a case where electrons are extracted from a floating gate may be a write mode.

Although in this embodiment mode, description is made of a case where one NAND cell has 32 memory elements, the number of memory elements is not limited to this. Further, in a unit cell, the selection transistors S1 and S2 are provided for one NAND cell; however, they are not always required and may be omitted.

Next, technology for higher integration of the present invention is described.

Each of FIGS. 2 to 4 shows an equivalent circuit of a unit cell of the NAND memory cell array. In the unit cell, the selection transistors S1 and S2 and the nonvolatile memory elements M0 to M31 are connected in series. Therefore, as shown in FIG. 1, they can be collectively formed using one semiconductor layer 34. Thus, a wiring for connecting the nonvolatile memory elements M0 to M31 can be omitted, which enables higher integration.

Further, in the unit cell, a semiconductor layer 36 of the selection transistors S1 and S2 and a semiconductor layer 38 of the NAND cell may be formed separately.

Further, a plurality of NAND cells provided in the block BLK1 may be formed using one semiconductor layer 40. In other words, all of the nonvolatile memory elements provided in the block BLK1 may be formed using one semiconductor layer 40.

Hereinafter, a specific example of higher integration is described. First, description is made of a structure of the NAND memory cell array manufactured by the conventional LSI technology with reference to FIGS. 5 to 6C.

Figure 5:
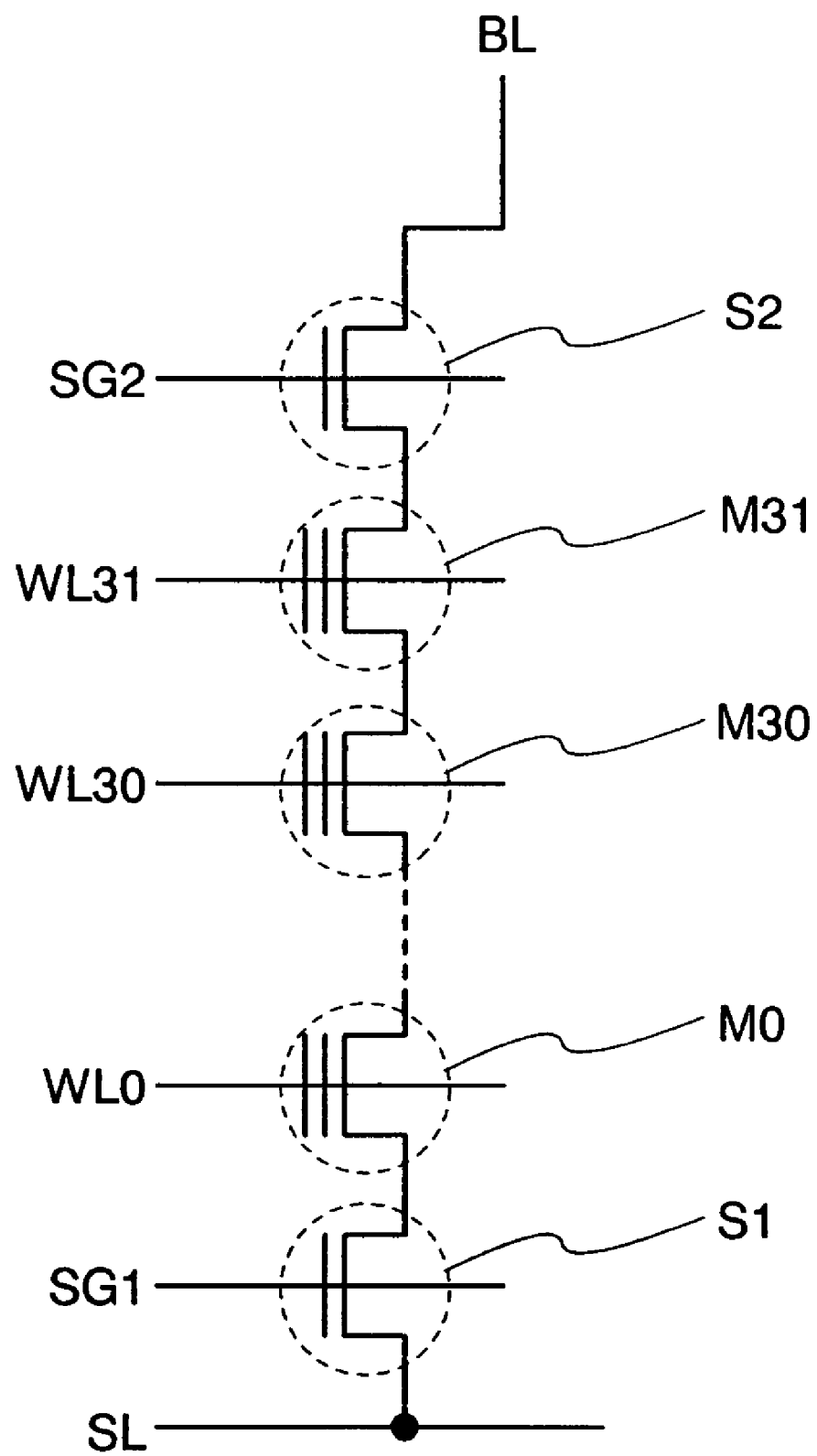
FIG. 5 is an equivalent circuit diagram of the conventional NAND memory cell (Embodiment Mode 1).
Figure 6A:
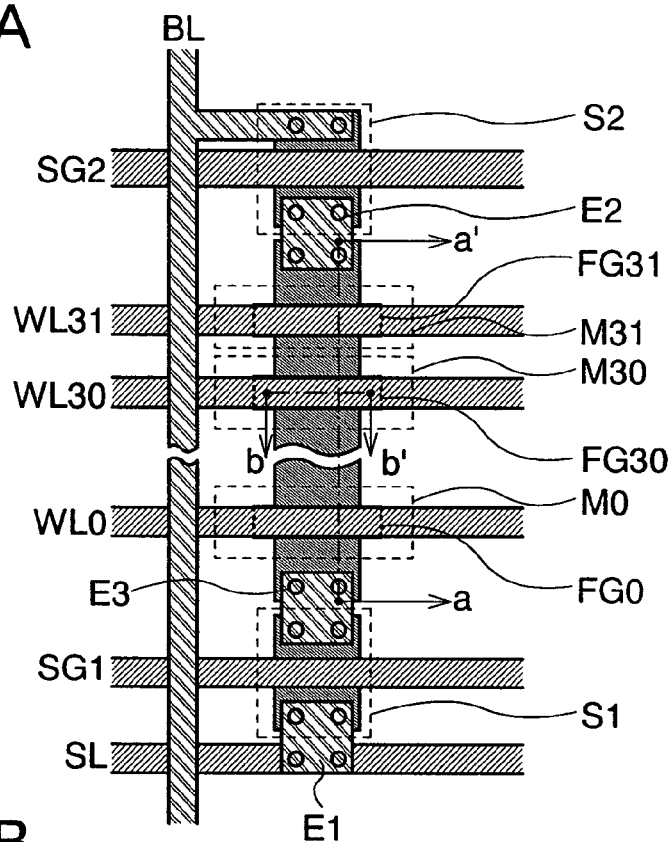
FIGS. 6A to 6C show a layout of the conventional NAND memory cell (Embodiment Mode 1).
Figure 6B:
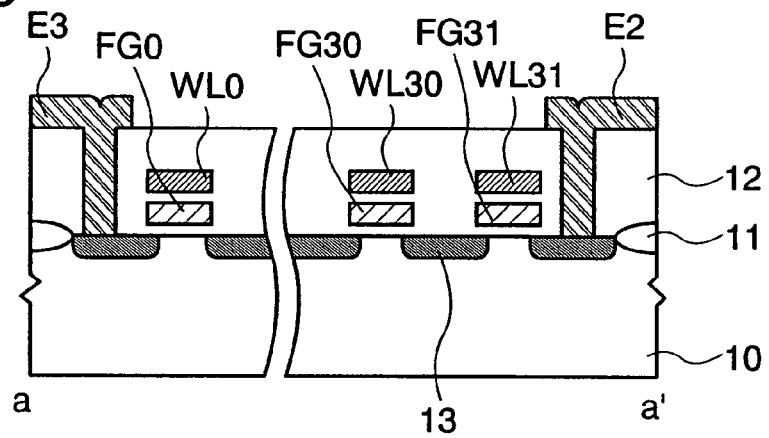

FIG. 5 is an equivalent circuit diagram of a unit cell of the conventional NAND memory cell array. FIG. 6A is a layout of FIG. 5. FIG. 6B is a cross sectional view in a bit line direction, which is taken along a dashed-dotted line a-a' in FIG. 6A. In addition, FIG. 6C is a cross sectional view in a word line direction, which is taken along a dotted line b-b' in FIG. 6A.

Figure 6C:
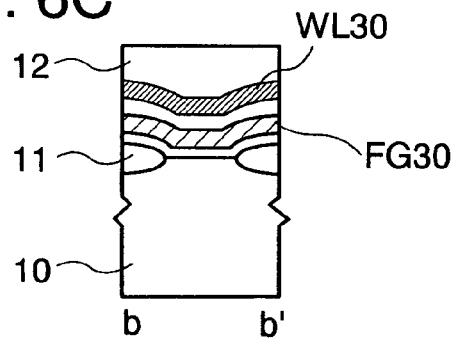

In FIGS. 6A to 6C, FG0 to FG 31 are floating gates of the memory elements M0 to M31. Control gates of the memory elements M0 to M31 are a part of the word lines WL0 to WL31. A reference numeral 10 denotes a silicon wafer, 11 denotes LOCOS (Local Oxidation of Silicon), 12 denotes an interlayer insulating film, and 13 denotes a high concentration impurity region functioning as a source electrode or a drain electrode. The selection transistor S1 is connected to the source line SL by an electrode E1, and to the NAND cell in series by an electrode E3. The selection transistor S2 is connected to the NAND cell in series by the electrode E1.

Figure 7:
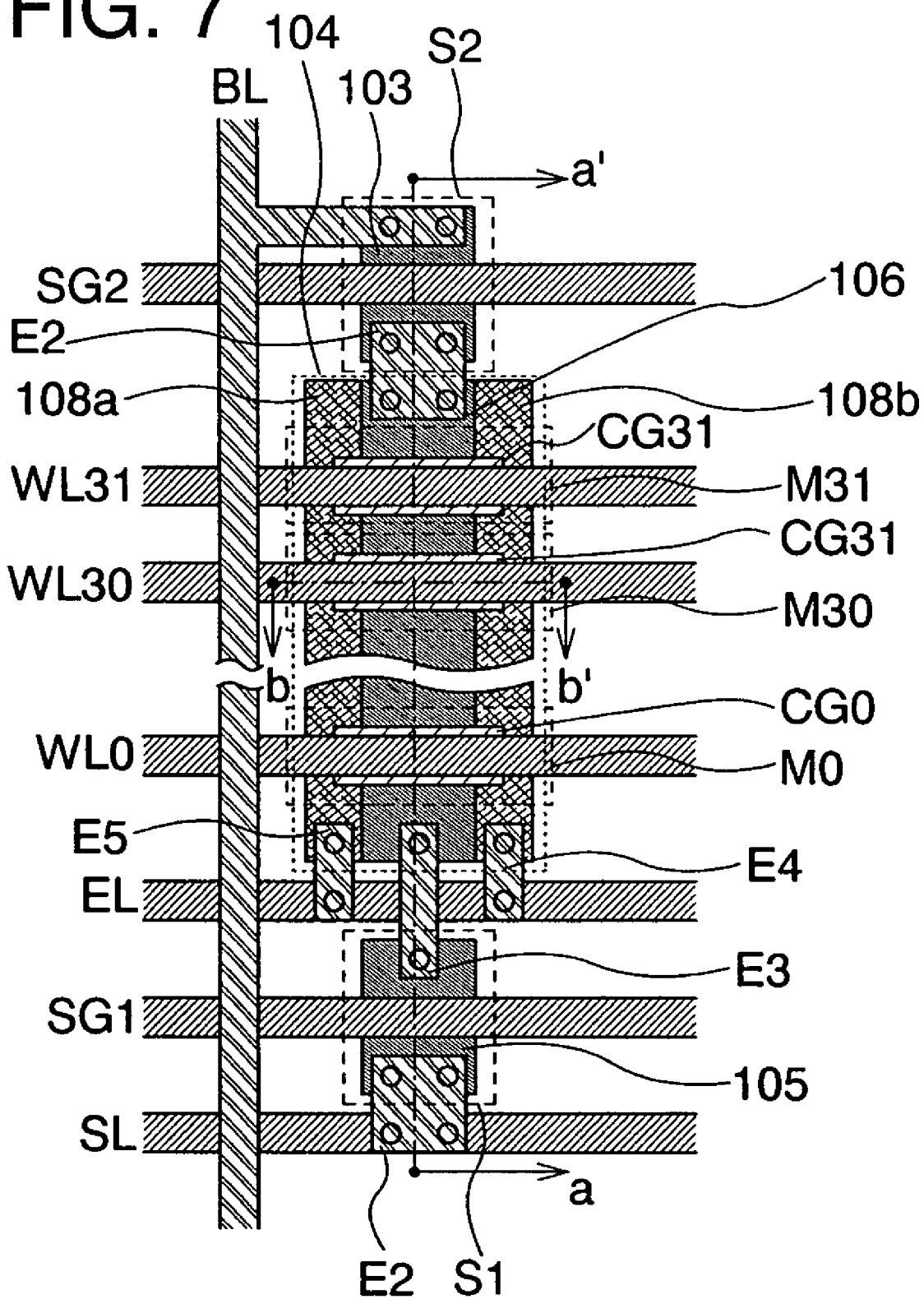
FIG. 7 is a layout of a NAND memory cell of the present invention (Embodiment Mode 1).
Figure 8A:
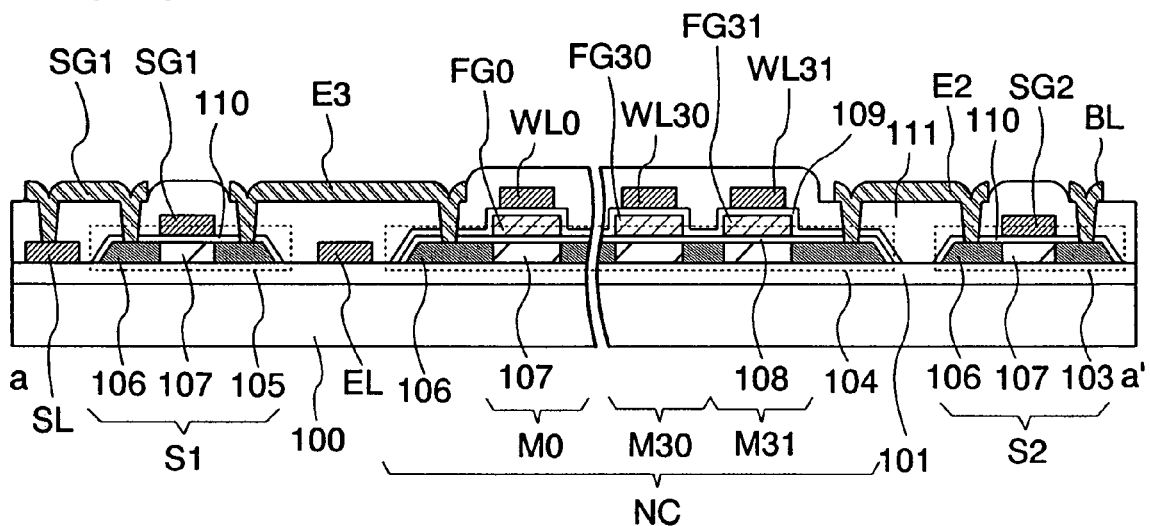
FIGS. 8A and 8B are cross sectional views of a NAND memory cell of the present invention and FIG. 8C is a top plan view of a semiconductor film of the memory cell (Embodiment Mode 1).
Figure 8B:
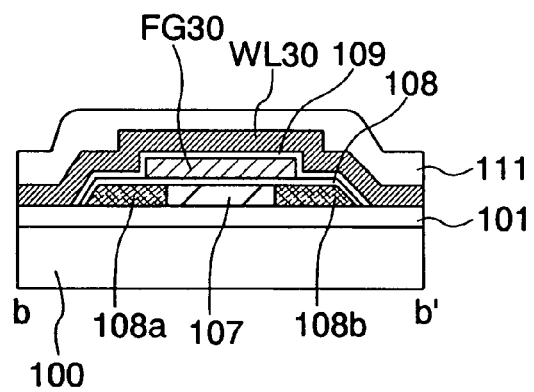
Figure 8C:
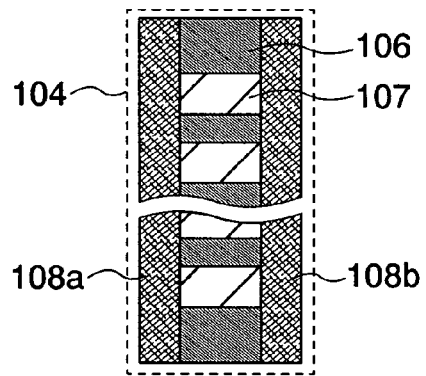

FIG. 7 shows a layout of a unit cell of the NAND memory cell array of the present invention. An equivalent circuit of FIG. 7 is shown in FIGS. 2 to 4. Further, FIGS. 8A to 8C each show a cross sectional view of FIG. 7. FIG. 8A is a cross sectional view in a bit line direction, which is taken along a dashed-dotted line a-a' in FIG. 7. FIG. 8B is a cross sectional view in a word line direction, which is taken along a dotted line b-b' in FIG. 7. In addition, FIG. 8C is a top plan view of a semiconductor film of the NAND cell shown in FIG. 7.

A feature of the present invention is that a nonvolatile memory element and a selection transistor are provided on an insulating surface. The insulating surface may be a surface of the following substrate formed of an insulator: a glass substrate such as a barium borosilicate glass or an aluminoborosilicate glass, a quartz substrate, a ceramic substrate such as sapphire, a plastic substrate, or the like.

Further, a surface of an insulating film formed on the surface of the substrate can be an insulating surface. The insulating film can be formed of a single film or stacked films of silicon oxide, silicon nitride, silicon oxynitride ($SiO_xN_y$ (x>y>0)), silicon nitride oxide ($SiN_xO_y$ (x>y>0)), aluminum nitride, and the like.

When an insulating film is formed, a conductive substrate of stainless steel or the like or a semiconductor substrate which has an insulating film on the surface thereof can be used instead of the substrate formed of an insulator, as a substrate. In a case of using a substrate including impurities such as sodium which adversely affect a semiconductor element, for example, glass substrate, the insulating film is preferably formed on the surface of the substrate. FIGS. 7 to 8C show an example where an insulating film 101 is formed over a substrate 100.

As shown in FIGS. 7 to 8C, in the present invention, a NAND cell NC and a pair of low concentration impurity regions 108a and 108b are formed using an island-shaped semiconductor film 104 on an insulating surface, and the selection transistors S1 and S2 are formed using semiconductor films 103 and 105.

In each of the semiconductor films 103 to 105, a channel formation region 107 and a high concentration impurity region 106 functioning as a source electrode or a drain electrode are formed. In the semiconductor film 104, a pair of low concentration impurity regions 108a and 108b (also referred to as a semiconductor impurity region) are formed.

Here, the high concentration impurity region 106 and the low concentration impurity regions 108a and 108b are regions that have different conductivity types. In a case where the high concentration impurity region 106 has N-type conductivity, the low concentration impurity regions 108a and 108b are formed so as to have P-type conductivity. Whereas in a case where the high concentration impurity region 106 has P-type conductivity, the low concentration impurity regions 108a and 108b are formed so as to have N-type conductivity. Accordingly, a PN junction is formed by the high concentration impurity region 106 and the low concentration impurity regions 108a and 108b (see FIG. 8C).

Another feature of the present invention is that each terminal (each source electrode and each drain electrode, and corresponding to the high concentration impurity region 106) is diode-connected to the erasing line EL by the low concentration impurity regions 108a and 108b.

Further, in FIGS. 8A and 8B, a reference numeral 108 denotes a first gate insulating film of the memory element, 109 denotes a second gate insulating film, 110 denotes a gate insulating film of the selection transistors S1 and S2, and 111 denotes an interlayer insulating film. The floating gates FG0 to FG31 of the memory elements M0 to M31 are formed over the first gate insulating film 108. The second gate insulating film 109 is formed over the floating gates FG0 to FG 31. Control gates of the memory elements M0 to M31 are formed over the second gate insulating film 109. The control gates of the memory elements M0 to M31 are a part of the bit lines WL0 to WL31.

Figure 9A:
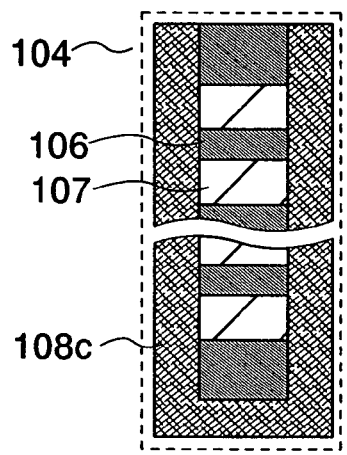
FIGS. 9A to 9D each show a top plan view of a semiconductor film of a NAND cell of the present invention (Embodiment Mode 1).
Figure 9B:
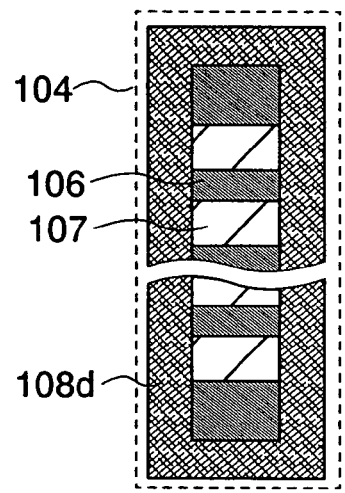

Further, in the semiconductor film 104, the low concentration impurity regions 108a and 108b are formed for both ends of the high concentration impurity region 106 so that all the high concentration impurity regions 106 are connected to each other, as shown in FIG. 8C. That is, although source electrodes and drain electrodes of the memory elements M0 to M31 are connected to each other by the low concentration impurity regions 108a and 108b, only one of the low concentration impurity regions 108a and 108b may be formed. Alternatively, the low concentration impurity regions 108a and 108b may be connected to each other. For example, as shown in FIG. 9A, a low concentration impurity region 108c in which regions are joined on the erasing line EL side can be formed. The regions can also be connected on the selection transistor S2 side. Alternatively, as shown in FIG. 9B, the low concentration impurity regions may be joined both on the erasing line EL side and on the selection transistor S2 side. In this case, the low concentration impurity region 108d is formed so as to surround the semiconductor film 104.

Figure 9C:
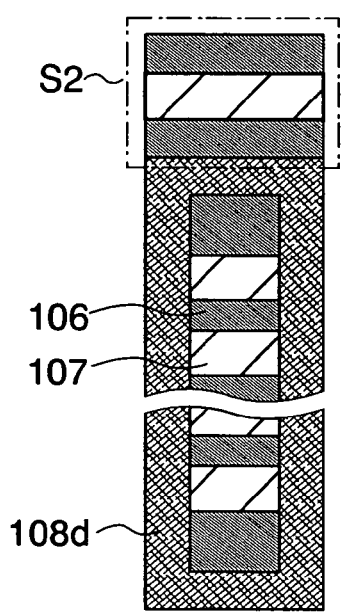

In a case where a joined low concentration impurity region is on the selection transistor S2 side, the selection transistor S2 and the NAND cell NC can be formed using one semiconductor film. An example of the case is shown in FIG. 9C.

Figure 9D:
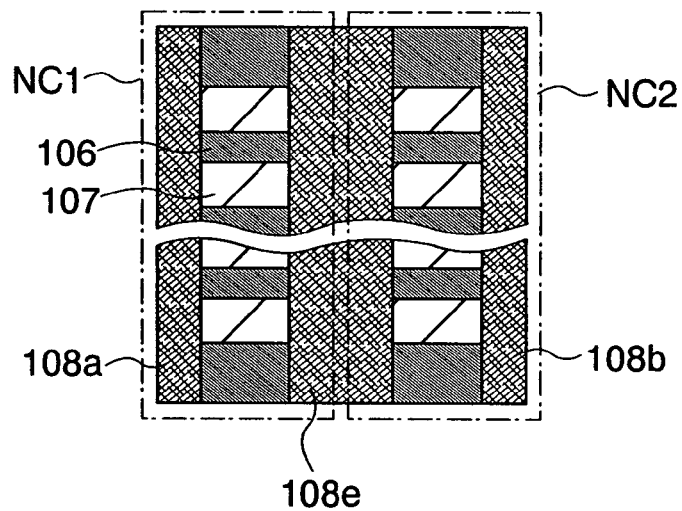

Alternatively, low concentration impurity regions of the NAND cells NC1 and NC2 adjacent to each other may be connected. FIG. 9D shows an example in which the low concentration impurity regions are thus joined. The reference numeral 108e denotes the connecting low concentration impurity region. In this case, one or both of the low concentration impurity regions 108a and 108b can be omitted.

As shown in FIG. 9D, joining low concentration impurity regions allows a plurality of NAND cells to be formed of one semiconductor film. Therefore, integration degree is improved and high-capacity memory device can be obtained. By application of the example of FIG. 9B to FIG. 9D, the low concentration impurity regions of the NAND cells of all memory cell arrays can be common. In that case, for reduction of charging time, leading of the erasing line EL at the control gate may be increased and then directly connected to source electrodes and drain electrodes (the high concentration impurity regions 106) of the memory elements M0 to M31.

Figure 10:
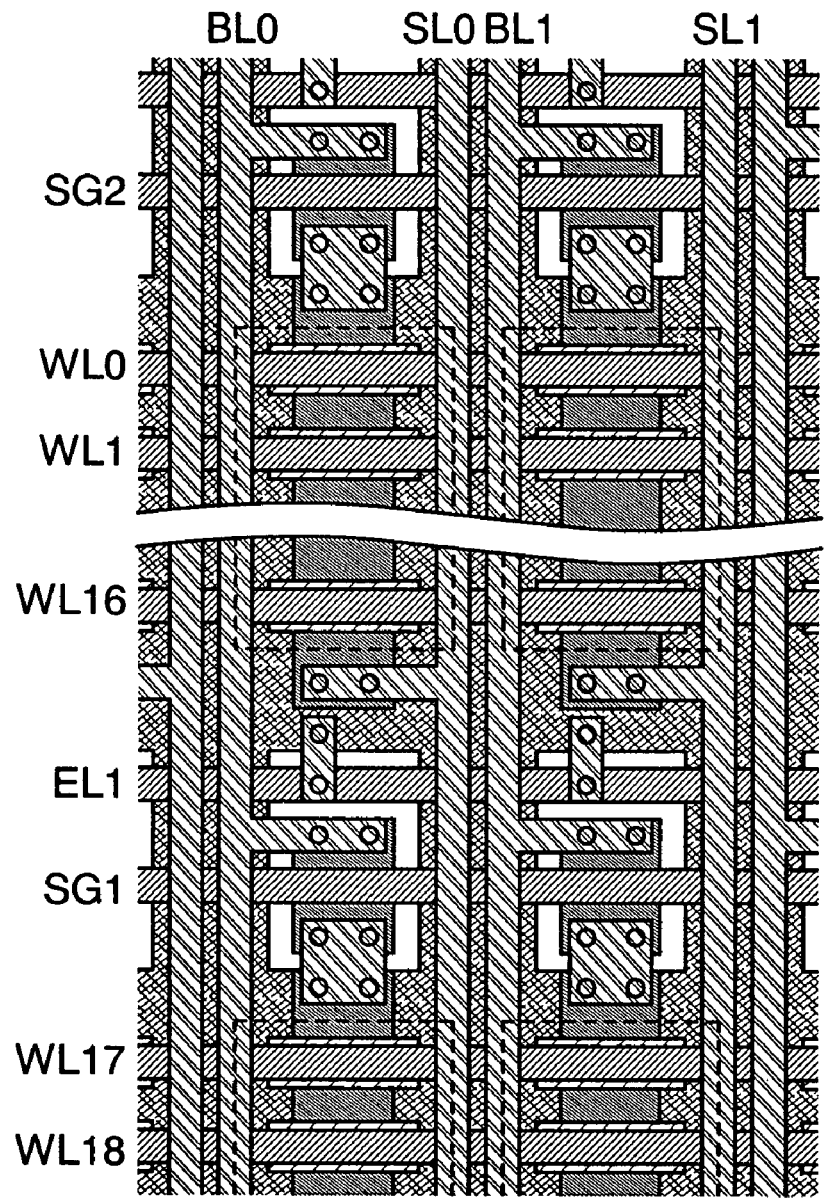
FIG. 10 is a layout of a NAND memory cell of the present invention (Embodiment Mode 1).

FIG. 10 shows an example in which the low concentration impurity regions of the left, right, top, and bottom of NAND cells NCs adjacent to each other are common. In this example, the source line SL is arranged in parallel with the bit line BL, the NAND cells each include 16 memory elements, and the selection transistor S1 is provided for each NAND cell.

Figure 11A:
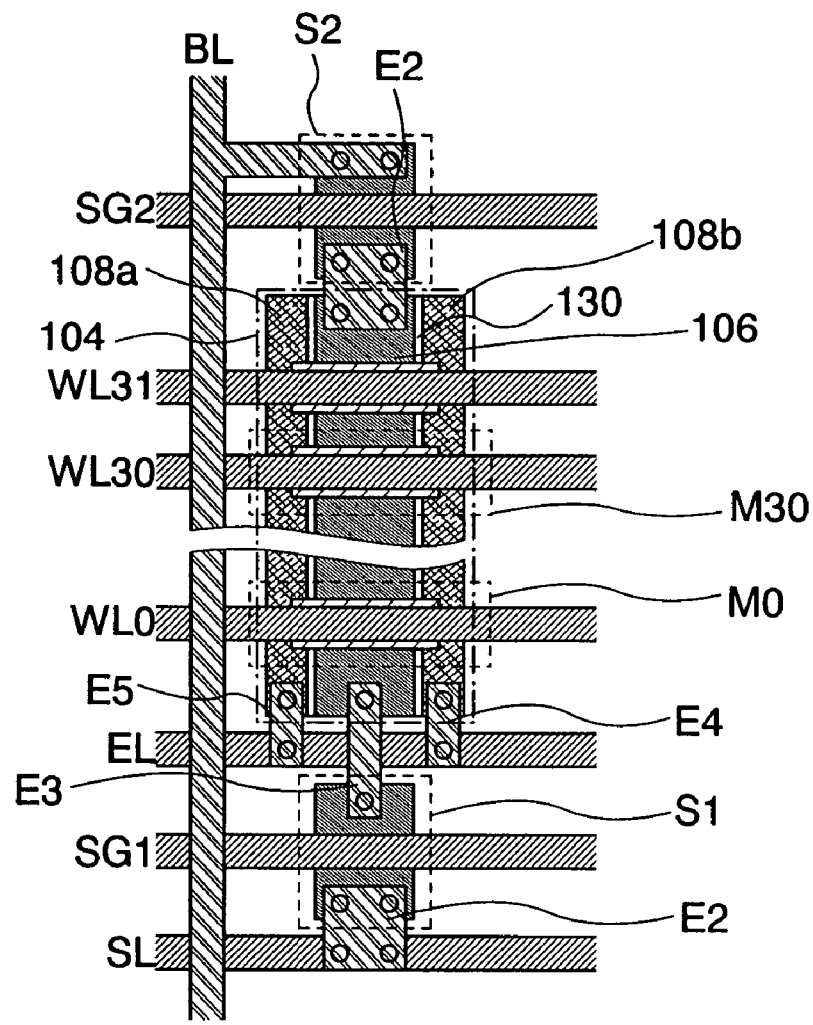
FIGS. 11A and 11B are layouts of a NAND memory cell of the present invention (Embodiment Mode 1).

A semiconductor region 130 which has high resistance and different impurity concentration from the high concentration impurity region 106 and the low concentration impurity regions 108a and 108b can be inserted in the junction of the high concentration impurity region 106 and the low concentration impurity regions 108a and 108b. FIG. 11A shows an example of a layout in which the semiconductor region 130 is provided between the high concentration impurity region 106 and each of the low concentration impurity regions 108a and 108b. Further, FIG. 11B shows a top plan view of the semiconductor film 104 of the NAND cell provided with the semiconductor region 130.

Figure 11B:
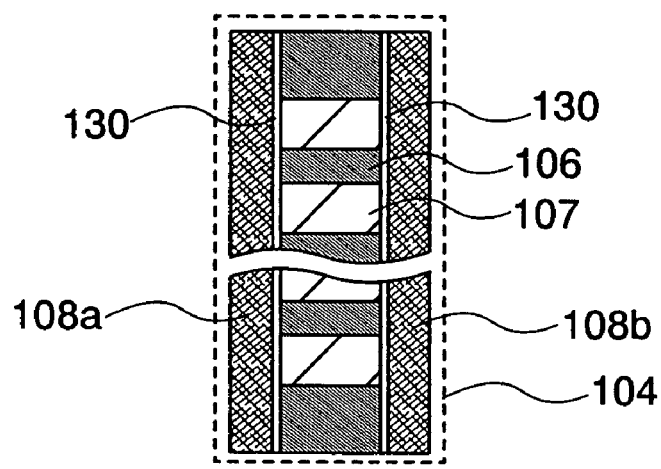

As shown in FIG. 11B, the semiconductor region 130 is provided in the junction of the high concentration impurity region 106 and each of the low concentration impurity regions 108a and 108b. The semiconductor region 130 can be formed as a region similar to a non-doped region (a region to which an impurity imparting a conductivity type is not added purposely), an I type region or the channel formation region 107. Thus, a PIN junction can be formed by the high concentration impurity region 106, the semiconductor region 130, and the low concentration impurity regions 108a and 108b.

The semiconductor region 130 may be a region that can form the aforementioned PIN junction. For example, the semiconductor region 130 can be formed to have the same conductivity type as the low concentration impurity regions 108a and 108b and lower impurity concentration than the low concentration impurity regions 108a and 108b. When the low concentration impurity regions 108a and 108b are an n⁻ region or a p⁻ region, the semiconductor region 130 can be formed as an n⁻ region or a p⁻ region. Alternatively, the semiconductor region 130 can be a region having the same conductivity type as the high concentration impurity region 106. In this case, if the high concentration impurity region 106 is an n⁺ region or a p⁺ region, the semiconductor region 130 may be formed as an n⁻ region or a p⁻ region. Thus, by provision of the semiconductor region 130, a PIN junction diode is formed. Therefore, reliability of a nonvolatile memory element can be improved.

Although a layout of FIG. 11A corresponds to FIG. 7, it is needless to say that the semiconductor region 130 may be applied to the other layout examples.

Note that the case where the source line SL is arranged in parallel with the word line WL is shown in this specification; however, an arrangement method is not limited to this. Alternatively, the source line SL may be arranged in parallel with the bit line BL; the NAND cell of one row is not connected to a source electrode or a drain electrode of each selection transistor S2; and the NAND cell of one column may be connected to a source electrode or a drain electrode of each selection transistor S2.

Embodiment Mode 2

Figure 12:
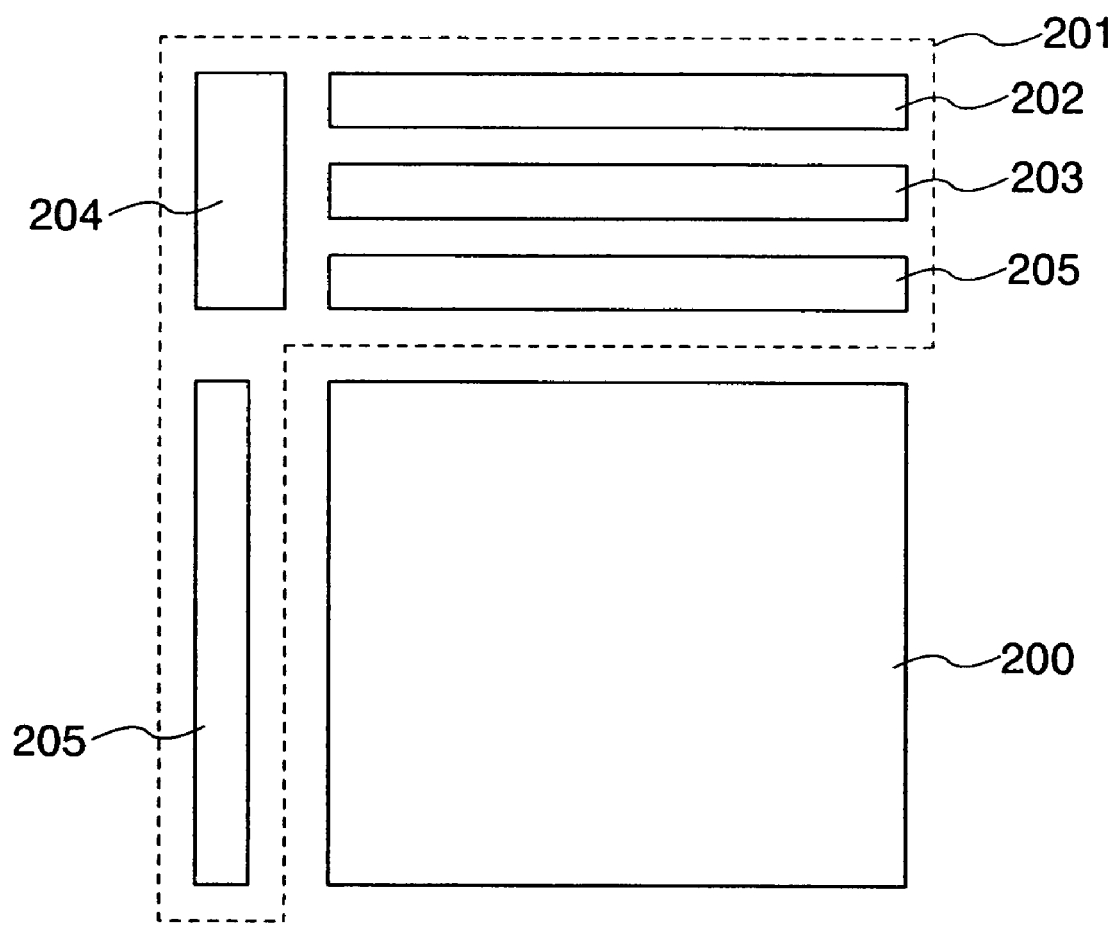
FIG. 12 is a block circuit diagram of a memory device of the present invention (Embodiment Mode 2).

An example in which the present invention is applied to a memory device provided with a nonvolatile memory element is shown. FIG. 12 shows an example of a circuit block diagram of the memory device. In a nonvolatile semiconductor memory device, a memory array portion 200 including a plurality of memories arranged in matrix and a peripheral circuit 201 are provided over the same substrate. The peripheral circuit 201 includes an interface circuit 202 for externally communicating address data, memory data or the like, a sense circuit 203 for determining I/O of data stored in a memory, a decoder 205 for selecting a memory cell, and a control circuit 204 for supplying a signal and power to each circuit depending on an operation mode such as writing, reading or erasing.

In the memory array portion 200, the NAND cell described in Embodiment Mode 1 is provided. Further, the memory array portion 200 and the peripheral circuit 201 are formed at the same time on the same insulating surface by the SOI technology. In other words, the memory array portion 200 and the peripheral circuit 201 are formed on the same insulating surface through the same process.

As described in Embodiment Mode 1, when the semiconductor layer is formed on the insulating surface and separated into island-shaped semiconductor layers, element separation can be performed effectively even in the case where a memory element array and a peripheral circuit are formed over one substrate. Therefore, even when a memory element array in which a voltage of from approximately 10 V to 20 V is required for reading and erasing, and a peripheral circuit which operates at a voltage of from approximately 3V to 7V to mainly input and output data and control commands are formed over one substrate, mutual interference due to the difference of the voltage applied to each element can be prevented.

Embodiment Mode 3

A floating gate type nonvolatile memory is required to have a capability of retaining charges stored in a floating gate for 10 years or more to ensure reliability. Accordingly, a tunnel insulating layer is required to be formed with a thickness such that tunneling current can flow and to have high insulation property for preventing electron leakage.

Further, the floating gate formed over the tunnel insulating layer is formed of silicon which is the same semiconductor material as the semiconductor layer in which the channel formation region is formed. Specifically, a method for forming a floating gate from polycrystalline silicon is widely used. For example, a polysilicon film deposited with a thickness of 400 nm is known (see Patent Document 1).

Since the floating gate of the nonvolatile memory is formed of polycrystalline silicon, the energy level of the bottom of the conduction band of the floating gate is the same as that of the semiconductor layer (channel formation region). When the floating gate is formed of polycrystalline silicon with a thinner thickness, it rather has higher energy level of the bottom of the conduction band than the semiconductor layer in which the channel formation region is formed. In that case, electrons are not easily injected into the floating gate from the semiconductor layer; therefore, high write voltage is required. Accordingly, in order to reduce write voltage of the nonvolatile memory of which floating gate is formed of polycrystalline silicon to any extent, the floating gate is required to be added with an n-type impurity such as phosphorus or arsenic to have conductivity. As for a gate insulating layer provided between the floating gate and the semiconductor layer, the tunnel insulating layer is required to be thin so that writing is performed at a low voltage. On the other hand, in order to stably retain the charges of the floating gate for a long period of time, the tunnel insulating layer is required to be thick so that leakage of the charges and intrusion of impurities are prevented.

Therefore, a conventional nonvolatile memory requires high write voltage. Further, in order to counter degradation of charge retention characteristics due to repetitive rewriting, a redundant memory cell is provided or a controller is devised so that resolutions such as error detection and error correction are performed, whereby reliability is ensured.

Thus in this embodiment mode, description is made of a nonvolatile memory element superior in writing characteristics and charge retention characteristics.

Figure 13:
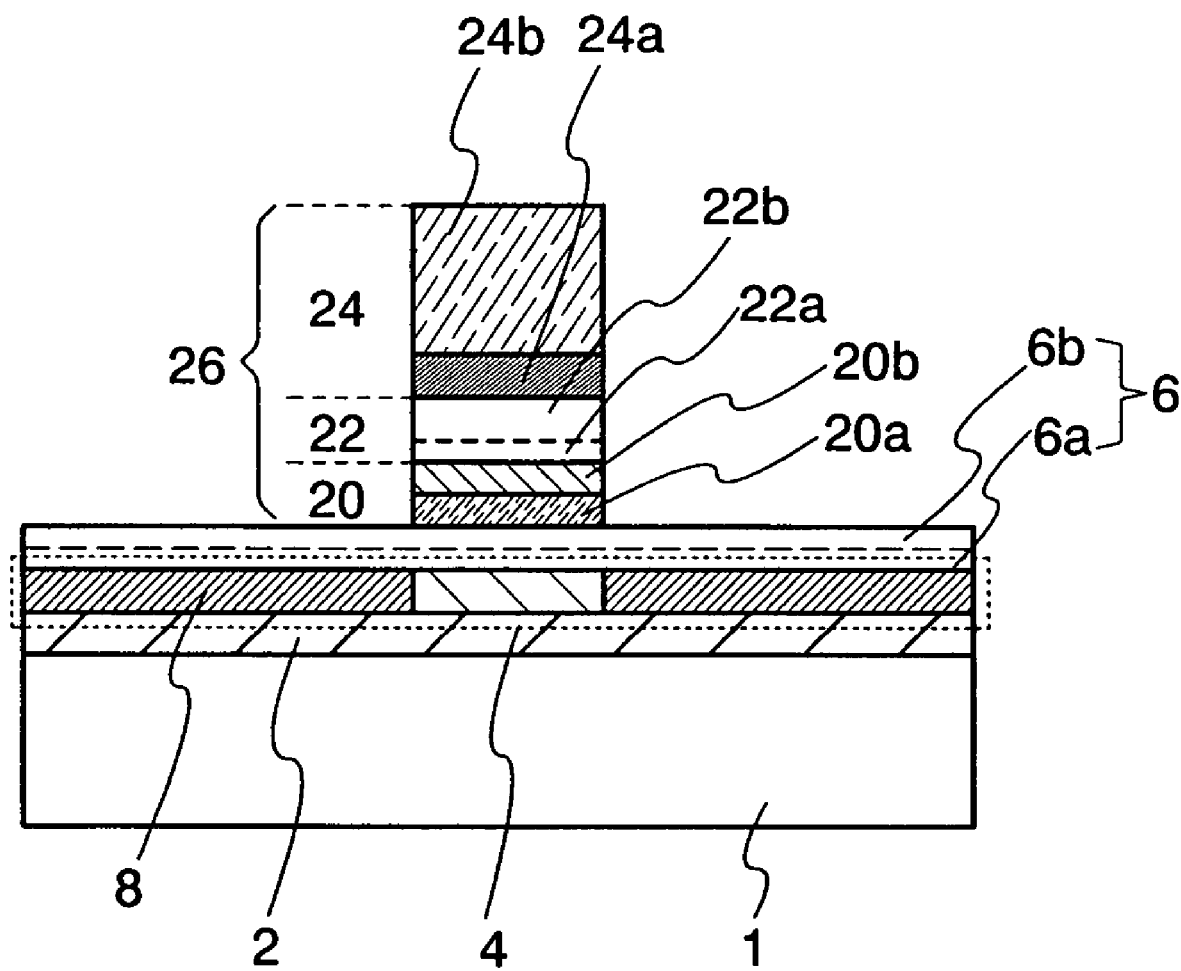
FIG. 13 is a cross sectional view of a nonvolatile memory element (Embodiment Mode 3).

FIG. 13 shows an essential part of the nonvolatile memory element of this embodiment mode. FIG. 13 is a cross sectional view of a nonvolatile memory element along a bit line direction. This nonvolatile memory element is manufactured using a substrate 1 having an insulating surface. As the substrate 1 having an insulating surface, a glass substrate, a quartz substrate, a sapphire substrate, a ceramic substrate, a metal substrate provided with an insulating layer on its surface, or the like can be used.

An island-shaped semiconductor film 4 is formed over the substrate 1 having an insulating surface. A base insulating film 2 may be provided between the substrate 1 and the semiconductor film 4. This base insulating film 2 may be appropriately provided as a blocking layer, thereby preventing impurities such as alkali metal from diffusing into the semiconductor film 4 from the substrate 1 and from contaminating the semiconductor film 4.

The base insulating film 2 is formed of an insulating material such as silicon oxide ($SiO_x$), silicon nitride ($SiN_x$), silicon oxynitride ($SiO_xN_y$, x>y>0) or silicon nitride oxide ($SiN_xO_y$, x>y>0), by a CVD method, a sputtering method or the like. For example, in a case where the base insulating film 2 has a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film.

The semiconductor film 4 is preferably formed of a single crystal semiconductor or a polycrystalline semiconductor. For example, a semiconductor layer formed all over the substrate 1 by a sputtering method, a plasma CVD method or an LPCVD method is selectively etched after being crystallized, so that the semiconductor film 4 is formed. Specifically, for the purpose of element separation, it is preferable to form an island-shaped semiconductor layer on the insulating surface, and to form one or a plurality of nonvolatile memory elements over the semiconductor layer.

As the semiconductor material, silicon is preferable. Alternatively, a silicon germanium semiconductor may be used. The semiconductor film may be crystallized by a crystallization method such as a laser crystallization method, a crystallization method by heat treatment using rapid thermal annealing (RTA) or an annealing furnace, a crystallization method using a metal element promoting crystallization, or a combination of them. Further, instead of such a thin film process, a so-called SOI (Silicon on Insulator) substrate provided with a single crystalline semiconductor layer on the insulating surface may be used.

Thus, when a semiconductor film is formed on the insulating surface and separated into island-shaped semiconductor films, element separation can be carried out effectively even in the case where a memory element array and a peripheral circuit are formed over one substrate. Specifically, even when a memory element array in which a voltage of from approximately 10 V to 20 V is required for reading and erasing, and a peripheral circuit which operates at a voltage of from approximately 3V to 7V to mainly input and output data and control commands are formed over one substrate, mutual interference due to the difference of the voltage applied to each element can be prevented.

A p-type impurity may be injected into the semiconductor film 4. As the p-type impurity, for example, boron may be used and added at a concentration of from approximately $5\times10^{15}$ atoms/cm$^3$ to $1\times10^{16}$ atoms/cm$^3$. The impurity is added for controlling the threshold voltage of a transistor, and the impurity effectively operates when it is added to a channel formation region. The channel formation region is formed in a region almost corresponding to a gate 26 described below between a pair of high concentration impurity regions 8 of the semiconductor film 4.

The pair of high concentration impurity regions 8 functions as a source and a drain in the nonvolatile memory element. The pair of high concentration impurity regions 8 are formed by being doped with phosphorus or arsenic which is an n-type impurity at a concentration of approximately $1\times10^{19}$ atoms/cm$^3$ to $1\times10^{21}$ atoms/cm$^3$.

A first insulating layer 6, a floating gate electrode 20, a second insulating layer 22 and a control gate electrode 24 are formed over the semiconductor film 4. In this specification, a layered structure from the floating gate 20 to the control gate electrode 24 may be referred to as the gate 26.

The first insulating layer 6 is formed to have a stacked structure of silicon oxide or silicon oxide and silicon nitride.

The first insulating layer 6 may be formed by deposition of an insulating film by a plasma CVD method or an LPCVD method; however, it is preferably formed by solid-phase oxidation or solid-phase nitridation using plasma treatment. This is because the insulating layer formed by oxidization or nitridation of a semiconductor layer (typically, a silicon layer) by plasma treatment is dense and has a high withstand voltage and high reliability. Since the first insulating layer 6 is used as a tunnel insulating layer for injecting charges into the floating gate electrode 20, it is preferable that the insulating layer be durable. The first insulating layer 6 is preferably formed to have a thickness of from 1 nm to 20 nm, preferably from 3 nm to 6 nm. For example, when the gate length is 500 nm, the first insulating layer 6 can be formed to have a thickness of 3 nm to 6 nm.

For solid-phase oxidation or solid-phase nitridation by plasma treatment, it is preferable to use plasma excited by microwave (typically, 2.45 GHz) at an electron density of from $1\times10^{11}$ cm$^{-3}$ to $1\times10^{13}$ cm$^{-3}$ and at an electron temperature of from 0.5 eV to 1.5 eV. This is in order to form a dense insulating film and to obtain a practical reaction rate in solid-phase oxidation or solid-phase nitridation at 500° C. or less.

The oxidation of the surface of the semiconductor film 4 by this plasma treatment is performed in an oxygen atmosphere (for example, in an atmosphere containing oxygen ($O_2$) or dinitrogen monoxide ($N_2O$) and a rare gas (containing at least one of He, Ne, Ar, Kr and Xe) or in an atmosphere containing oxygen or dinitrogen monoxide, hydrogen ($H_2$) and a rare gas). The nitridation of the surface of the semiconductor film 4 by this plasma treatment is performed in a nitrogen atmosphere (for example, in an atmosphere containing nitrogen ($N_2$) and a rare gas (containing at least one of He, Ne, Ar, Kr and Xe), in an atmosphere containing nitrogen, hydrogen and a rare gas, or in an atmosphere containing $NH_3$ and a rare gas). As the rare gas, for example, Ar can be used. Alternatively, a gas in which Ar and Kr are mixed may be used.

Figure 14:
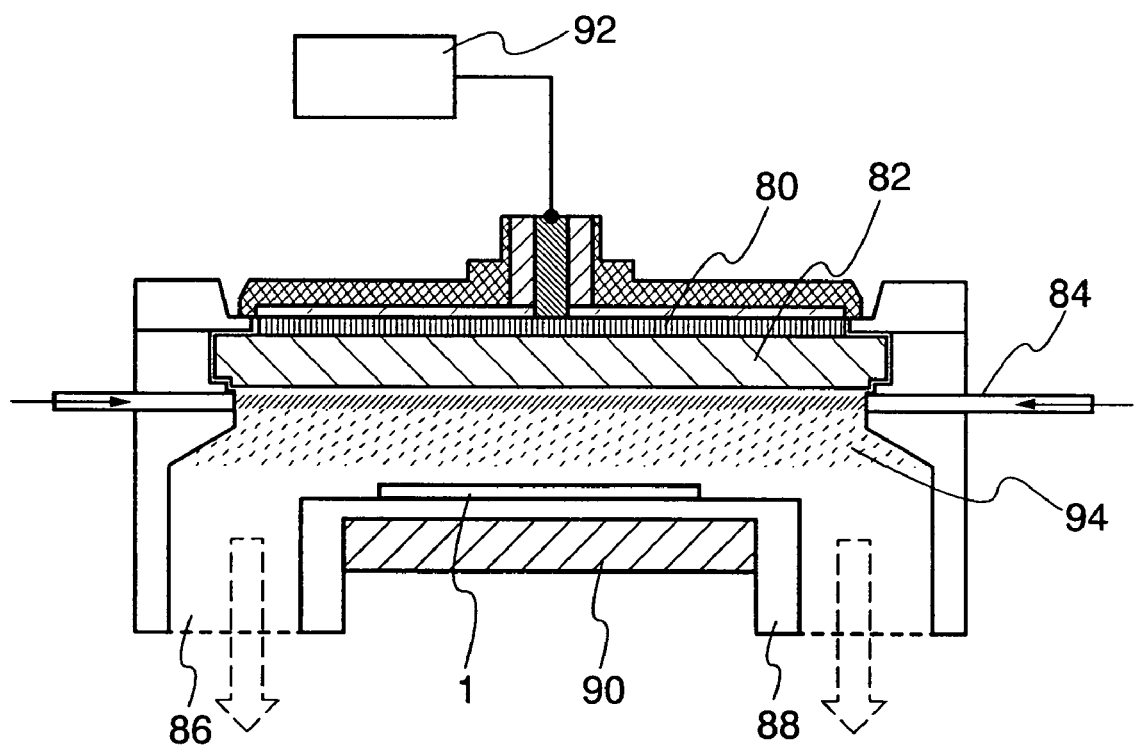
FIG. 14 is a view showing a structure of a plasma treatment apparatus (Embodiment Mode 3).

FIG. 14 shows a structure example of an apparatus for performing plasma treatment. This plasma treatment apparatus includes a supporting board 88 for being provided with the substrate 1, a gas supply portion 84 for introducing a gas, an exhaust port 86 connected to a vacuum pump for exhausting a gas, an antenna 80, a dielectric plate 82 and a microwave supply portion 92 for supplying a microwave for generating plasma. In addition, by provision of a temperature control portion 90 for the supporting board 88, the temperature of the substrate 1 can be controlled.

Hereinafter, plasma treatment is described. Note that the plasma treatment includes oxidation treatment, nitridation treatment, oxynitridation treatment, hydrogenation treatment and surface modifying treatment on a semiconductor layer, an insulating layer and a conductive layer. In each treatment, a gas supplied from the gas supply portion 84 can be selected in accordance with its purpose.

Oxidation treatment or nitridation treatment may be performed as follows. First, a treatment chamber is evacuated, and a plasma treatment gas containing oxygen or nitrogen is introduced from the gas supply portion 84. The substrate 1 has a room temperature or is heated to a temperature of 100° C. to 550° C. by the temperature control portion 90. Note that the distance between the substrate 1 and the dielectric plate 82 is approximately 20 mm to 80 nm (preferably, 20 mm to 60 nm).

Next, microwaves are supplied to the antenna 80 from the microwave supply portion 92. Then, the microwaves are introduced into the treatment chamber from the antenna 80 through the dielectric plate 82, whereby plasma 94 is generated. By excitation of plasma with microwave introduction, plasma with a low electron temperature (3 eV or less, preferably 1.5 eV or less) and a high electron density ($1\times10^{11}$ cm$^{-3}$ or more) can be generated. With oxygen radicals (which may include OH radicals) and/or nitrogen radicals (which may include NH radicals) generated by this high-density plasma, the surface of the semiconductor layer can be oxidized and/or nitrided. A rare gas such as argon is mixed into the plasma treatment gas, thereby effectively generating oxygen radicals or nitrogen radicals by excited species of the rare gas. This method enables solid-phase oxidation, solid-phase nitridation or solid-phase oxynitridation at a low temperature of 500° C. or lower by efficient utilization of the active radicals excited with the plasma.

FIG. 13 shows a preferable example of the first insulating layer 6 formed by plasma treatment. A silicon oxide layer 6a is formed to have a thickness of 3 nm to 6 nm by plasma treatment in an oxygen atmosphere on the semiconductor film 4, and then, the surface of the silicon oxide layer is treated in a nitrogen atmosphere to form a nitrogen plasma treatment layer 6b. Specifically, first, the silicon oxide layer 6a is formed to have a thickness of 3 nm to 6 nm by plasma treatment in an oxygen atmosphere on the semiconductor film 4. Subsequently, plasma treatment is performed in a nitrogen atmosphere to form the nitrogen plasma treatment layer with high nitrogen concentration on the surface or in the vicinity of the surface of the silicon oxide layer. Note that the vicinity of the surface means a region with a depth of approximately 0.5 nm to 1.5 nm from the surface of the silicon oxide layer. For example, a structure where nitrogen is contained at 20 to 50 atomic % in the depth of approximately 1 nm from the surface of the silicon oxide layer 6a by plasma treatment in a nitrogen atmosphere is employed.

For a typical example of the semiconductor film 4, the surface of the silicon layer is oxidized by plasma treatment so that a dense oxide film without distortion at the interface can be formed. Furthermore, a superficial oxygen layer is replaced by nitrogen to form a nitride layer by nitridation of the oxide film by plasma treatment, whereby further densification can be achieved. Consequently, an insulating layer having a high withstand voltage can be formed.

In any case, by solid-phase oxidation or solid-phase nitridation by the above plasma treatment, an insulating layer equivalent to a thermal oxide film formed at from 950° C. to 1050° C. can be obtained even in the case of using a glass substrate having an upper temperature limit of 700° C. or lower. Thus, a tunnel insulating layer having high reliability can be formed as the tunnel insulating layer of the nonvolatile memory element.

The floating gate electrode 20 is formed over the first insulating layer 6. The floating gate electrode 20 includes a first floating gate electrode layer 20a and a second floating gate electrode layer 20b. It is needless to say that the floating gate electrode 20 is not limited to have such a two-layer structure, and may have a stacked layer structure of plural layers. For the first floating gate electrode layer 20a formed in contact with the first insulating layer 6, a semiconductor material is preferably used, and a semiconductor material which satisfies one or a plurality of the following conditions can be selected.

It is preferable that a band gap of the semiconductor material forming the first floating gate electrode layer 20a be smaller than that of the semiconductor film 4. For example, it is preferable that there be a difference of 0.1 eV or more between the band gap of the semiconductor material forming the first floating gate electrode layer 20a and that of the semiconductor film 4, and the former be smaller than the latter. This is for the purpose of improving a carrier (electron) injecting property and charge retention characteristics by making the energy level of the bottom of a conduction band of the floating gate electrode 20 lower than that of the semiconductor film 4.

As the semiconductor material forming the first floating gate electrode layer 20a, a material having lower resistivity than the material forming the semiconductor film 4 is preferably used. In that case, a voltage applied between a control gate and a semiconductor layer is prevented from being divided, an electric field can act on the semiconductor layer effectively. For example, germanium is preferable since it has a specific resistance of 40 to 70 Ω·cm. Further, an n-type impurity may be added to the first floating gate electrode layer 20a for the purpose of reducing resistivity. Thus, the first floating gate electrode layer 20a is formed from a material having a smaller band gap and lower resistivity than those of the semiconductor film 4, thereby improving writing characteristics.

The semiconductor material forming the first floating gate electrode layer 20a is preferably such that a barrier energy generated by the first insulating layer 6 for electrons of the first floating gate electrode layer 20a be higher than that generated by the first insulating layer 6 against electrons of the semiconductor film 4. This is because it becomes easy to inject carriers (electrons) from the semiconductor film 4 into the first floating gate electrode layer 20a and charges are prevented from being discharged from the first floating gate electrode layer 20a.

As the semiconductor material used for the first floating gate electrode layer 20a, which satisfies the above conditions, germanium or a germanium compound can be typically used. As a typical example of the germanium compound, silicon-germanium can be given, which preferably contains germanium at 10 atomic % or more with respect to silicon in this case. This is because, if the concentration of the germanium is less than 10 atomic %, an effect of germanium as a constituting element is weakened and the band gap does not become small.

The floating gate is applied to the nonvolatile semiconductor memory device of the present invention for the purpose of accumulating charges; therefore, another material may be used for forming the floating gate as long as it has the similar function. For example, a ternary semiconductor material containing germanium can be used. The semiconductor material may be hydrogenated. Further, as long as a function as a charge accumulation layer of a nonvolatile memory element is provided, an oxide or a nitride of germanium or germanium compound, or an oxide or a nitride containing germanium or germanium compound may be used instead of the material.

It is preferable that a layer formed of a metal, an alloy thereof or a metal compound be used as the second floating gate electrode layer 20b provided on the second insulating layer 22 side so as to be in contact with the first floating gate electrode layer 20a. As a metal, a high melting point metal such as tungsten (W), tantalum (Ta), titanium (Ti), molybdenum (Mo), chromium (Cr) or nickel (Ni) is preferably used. Alternatively, an alloy using a plurality of sorts of the high melting point metals may be used. As a material forming an alloy with the high melting point metal, niobium, zirconium, cerium, thorium or hafnium may be used. Alternatively, oxide or nitride of the high melting point metal may be used. As the metal nitride, tantalum nitride, tungsten nitride, molybdenum nitride, titanium nitride or the like can be used. As the metal oxide, tantalum oxide, titanium oxide, molybdenum oxide or the like can be used.

The first floating gate electrode layer 20a can be stabilized when the second floating gate electrode layer 20b is formed of a metal or the like. Specifically, the second floating gate electrode layer 20b is formed on an upper layer side of the first floating gate electrode layer 20a formed of germanium or a germanium compound, so that it can be used as a barrier layer having water resistance and chemical resistance in a manufacturing process. Accordingly, the substrate can be easily handled in a photolithography step, an etching step and a cleaning step, thereby improving productivity. In other words, the floating gate can be easily processed.

The second insulating layer 22 is formed of a single layer or a plurality of layers of silicon oxide, silicon oxynitride ($SiO_xN_y$, (x>y)), silicon nitride ($SiN_x$), silicon nitride oxide ($SiN_xO_y$, (x>y)), aluminum oxide ($Al_xO_y$) and the like by an LPCVD method, a plasma CVD method, or the like. The second insulating layer 22 is preferably formed to have a thickness of 1 nm to 20 nm, preferably 5 nm to 10 nm. For example, a stack of a silicon nitride layer 22a with a thickness of 3 nm and a silicon oxide layer 22b with a thickness of 5 nm can be used. Alternatively, the second insulating layer 22 may be formed of aluminum oxide ($Al_xO_y$), tantalum oxide ($Ta_xO_y$) or hafnium oxide ($HfO_x$).

The control gate electrode 24 is preferably formed of a metal selected from tantalum (Ta), tungsten (W), titanium (Ti), molybdenum (Mo), chromium (Cr), niobium (Nb) and the like, or an alloy material or a compound material containing the metal as a main component. Alternatively, polycrystalline silicon to which an impurity element such as phosphorus is added may be used. Further alternatively, a stacked-layer structure of a metal nitride layer 24a including one layer or a plurality of layers and a metal layer 24b may be formed as the control gate electrode 24. As the metal nitride, tungsten nitride, molybdenum nitride or titanium nitride can be used. By provision of the metal nitride layer 24a, adhesiveness of the metal layer 24b can be improved and peeling can be prevented. A synergy between the second insulating layer 22 and the metal nitride having a high work function such as tantalum nitride makes it possible to form the first insulating layer 6 thick.

An operation principle of the nonvolatile memory element shown in FIG. 13 is described with reference to energy band diagrams. In the energy band diagrams described below, the same elements as those in FIG. 13 are denoted by the same reference numerals.

Figure 15:
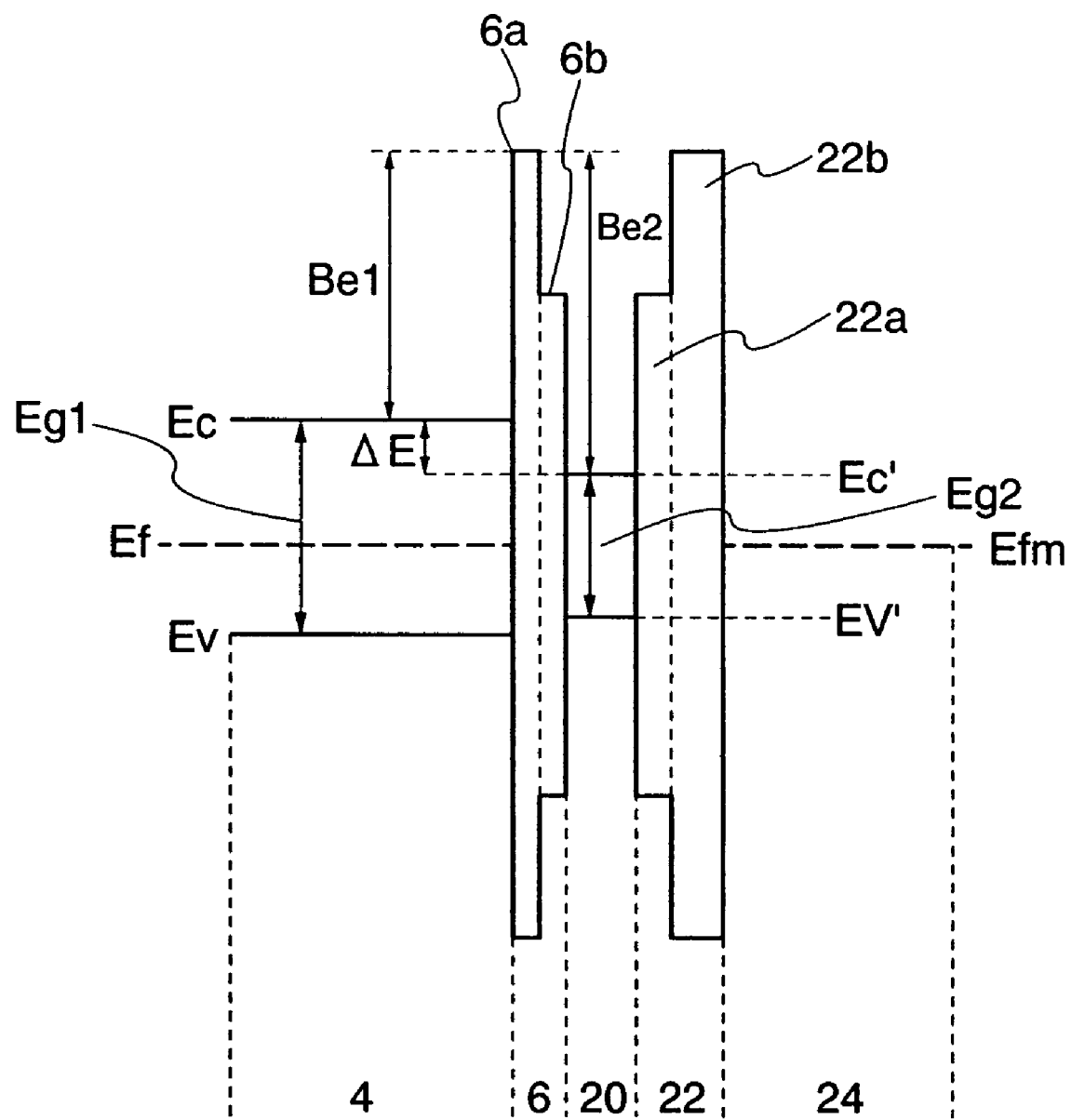
FIG. 15 is an energy band diagram of an initial state of a nonvolatile memory of Embodiment Mode 20 (Embodiment Mode 3).

FIG. 15 is an energy band diagram showing a state in which the semiconductor film 4, the first insulating film 6, the floating gate electrode 20, the second insulating layer 22 and the control gate electrode 24 are stacked. FIG. 15 shows a case in which a voltage is not applied to the control gate electrode 24 and the Fermi level Ef of the semiconductor film 4 is equal to the Fermi level Efm of the control gate electrode 24.

A different material is used for forming at least the first floating gate electrode layer 20a among the semiconductor film 4 and the floating gate electrode 20. A band gap Eg1 (energy difference between the lower end Ec of a conduction band and the upper end Ev of a valence band) of the semiconductor film 4 is different from a band gap Eg2 of the first floating gate electrode layer 20a, and the first floating gate electrode layer 20a has a smaller band gap than the semiconductor film 4 (Eg1>Eg2). For example, when the semiconductor film 4 is formed of silicon (1.12 eV), the first floating gate electrode layer 20a can be formed of germanium (0.72 eV) or silicon germanium (0.73 to 1.0 eV). Germanium or silicon germanium may be hydrogenated. In this case, germanium or silicon germanium may contain hydrogen at 1 to 30 atomic %. The first floating gate electrode layer 20a is formed of germanium containing hydrogen, thereby reducing a recombination center at an interface between the first insulating layer 6 and the first floating gate electrode layer 20a.

In a case of using a metal layer as the second floating gate electrode layer 20b, a work function of the metal material is preferably smaller than that of the first floating gate electrode layer 20a so that a barrier is not formed with respect to carriers (electrons) injected into the second floating gate electrode layer 20b. Accordingly, carriers (electrons) can be easily injected from the semiconductor film 4 into the second floating gate electrode layer 20b. A work function of germanium that can be used as the first floating gate electrode layer 20a is 5.0 eV; therefore, the following can be applied to the second floating gate electrode layer 20b, for example: tungsten (work function: 4.55 eV), tantalum (work function: 4.25 eV), titanium (work function: 4.33 eV), molybdenum (work function: 4.6 eV) and chromium (work function: 4.5 eV).

Note that the first insulating layer 6 is formed of the silicon oxide layer 6a (band gap: approximately 8 eV) and the nitrogen plasma treatment layer 6b (band gap: approximately 5 eV) which is obtained by nitridation of the silicon oxide layer 6a by plasma treatment. Further, the second insulating layer 22 has a structure where the silicon nitride layer 22a and the silicon oxide layer 22b are stacked from the floating gate electrode 20 side.

The semiconductor film 4 and the first floating gate electrode layer 20a are formed of different materials with the first insulating layer 6 interposed therebetween. In this case, the semiconductor film 4 and the first floating gate electrode layer 20a have different band gaps, and the first floating gate electrode layer 20a has a smaller band gap than the semiconductor film 4. For example, when the semiconductor film 4 is formed of silicon (band gap: 1.12 eV), the first floating gate electrode layer 20a can be formed of germanium (band gap: 0.72 eV) or silicon germanium (band gap: 0.73 to 1.1 eV). That is, the band gap Eg1 of silicon of the semiconductor film 4 and the band gap Eg2 of germanium of the first floating gate electrode layer 20a satisfy Eg1>Eg2.

As for the semiconductor film 4 and the first floating gate electrode layer 20a, energy barriers with respect to electrons formed by the first insulating layer 6, namely the first barrier energy Be1 and the second barrier energy Be2 have different values to satisfy the relationship of Be2>Be1. In this state, an energy difference ΔE occurs between the bottom energy levels of the conduction bands of the semiconductor film 4 and the floating gate electrode 20. As described below, this energy difference ΔE, which acts so as to accelerate electrons when the electrons are injected from the semiconductor film 4 to the floating gate electrode 20, contributes to decrease in write voltage.

Figure 16:
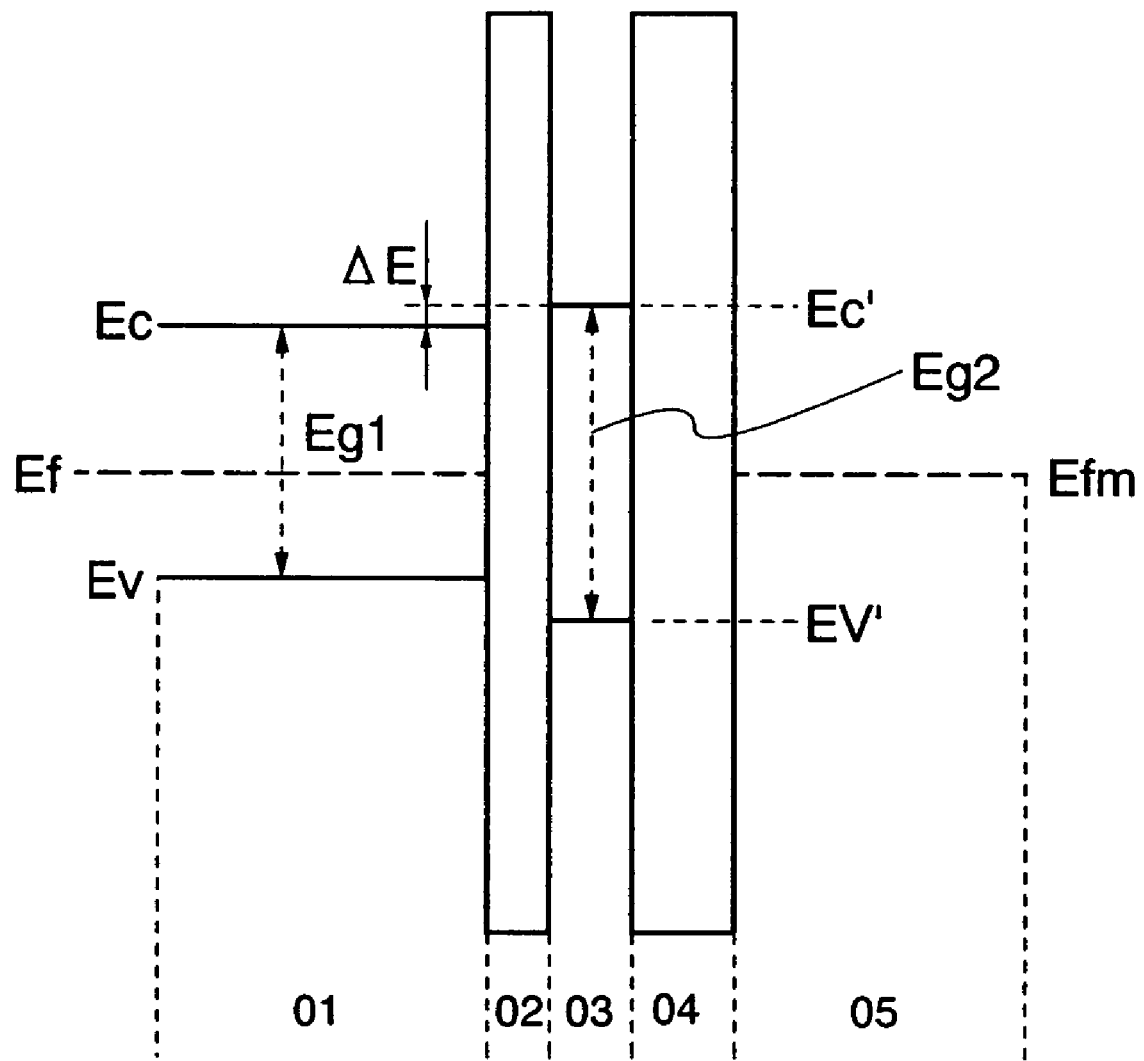
FIG. 16 is an energy band diagram of an initial state of a nonvolatile memory of a comparative example (Embodiment Mode 3).

For comparison, an energy band diagram in the case where a semiconductor layer and a floating gate electrode are formed of the same semiconductor material is shown in FIG. 16. This energy band diagram shows the state where a semiconductor layer 01, a first insulating layer 02, a floating gate electrode 03, a second insulating layer 04, and a control gate electrode 05 are stacked in this order. Even when the semiconductor layer 01 and the floating gate electrode 03 are formed from the same silicon material, the band gaps may differ if the floating gate electrode 03 is formed to be thin.

In FIG. 16, the band gap of the semiconductor layer 01 is denoted by Eg1 and the band gap of the floating gate electrode 03 is denoted by Eg2 (Eg1<Eg2). For example, it is said that when silicon is thinned, the band gap of silicon is increased to approximately 1.4 eV from 1.12 eV in the bulk state. Consequently, an energy difference −ΔE so as to obstruct injection of electrons occurs between the semiconductor layer 01 and the floating gate electrode 03. In this state, a high voltage is required to inject electrons from the semiconductor layer 01 into the floating gate electrode 03. That is, in order to decrease the write voltage, it is required that the floating gate electrode 03 be formed as thick as bulk silicon or it be doped with phosphorus or arsenic as an n-type impurity at a high concentration, which is a disadvantage of a conventional nonvolatile memory.

There are the following methods for injecting electrons into the floating gate electrode 20: a method utilizing thermoelectrons and a method utilizing an F-N tunneling current. In the case of utilizing thermoelectrons, a positive voltage is applied to the control gate electrode 24 and a high voltage is applied to a drain to generate thermoelectrons. Thus, the thermoelectrons can be injected into the floating gate electrode 20. In the case of utilizing the F-N tunneling current, a positive voltage is applied to the control gate electrode 24 so that electrons are injected into the floating gate electrode 20 from the semiconductor film 4 by using the F-N tunneling current.

Figure 17:
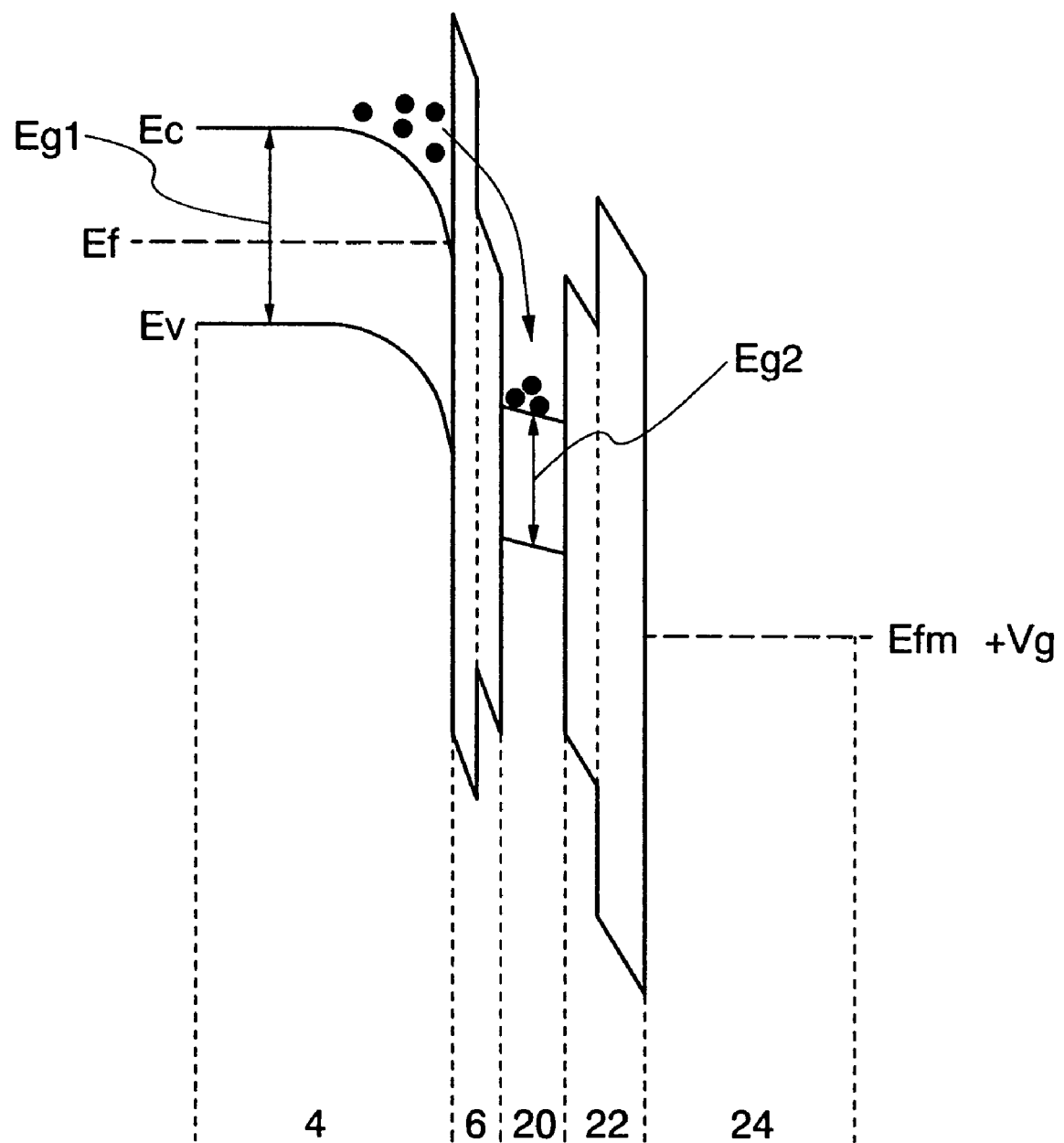
FIG. 17 is an energy band diagram of a write state of a nonvolatile memory of Embodiment Mode 22 (Embodiment Mode 3).

FIG. 17 is an energy band diagram in a writing state (see FIG. 2, Eg1>Eg2) described in Embodiment Mode 1. As shown in FIG. 17, the bottom energy level of the conduction band of the floating gate electrode 20 is lower than the bottom energy level of the conduction band of the semiconductor film 4 by $\Delta E$ in terms of electron energy. Therefore, an internal electrical field caused by this energy difference acts when electrons are injected into the floating gate electrode 20. This is realized by the above-described combination of the semiconductor film 4 and the floating gate electrode 20. That is, it becomes easy to inject electrons from the semiconductor film 4 into the floating gate electrode 20 so that writing characteristics in the nonvolatile memory element can be improved. This effect applies to the case of electron injection into the floating gate electrode 20 by utilization of thermoelectrons.

During a period in which electrons are held in the floating gate electrode 20, the threshold voltage of the nonvolatile memory element is shifted in a positive direction. This state corresponds to a state where data "0" is written.

Figure 18:
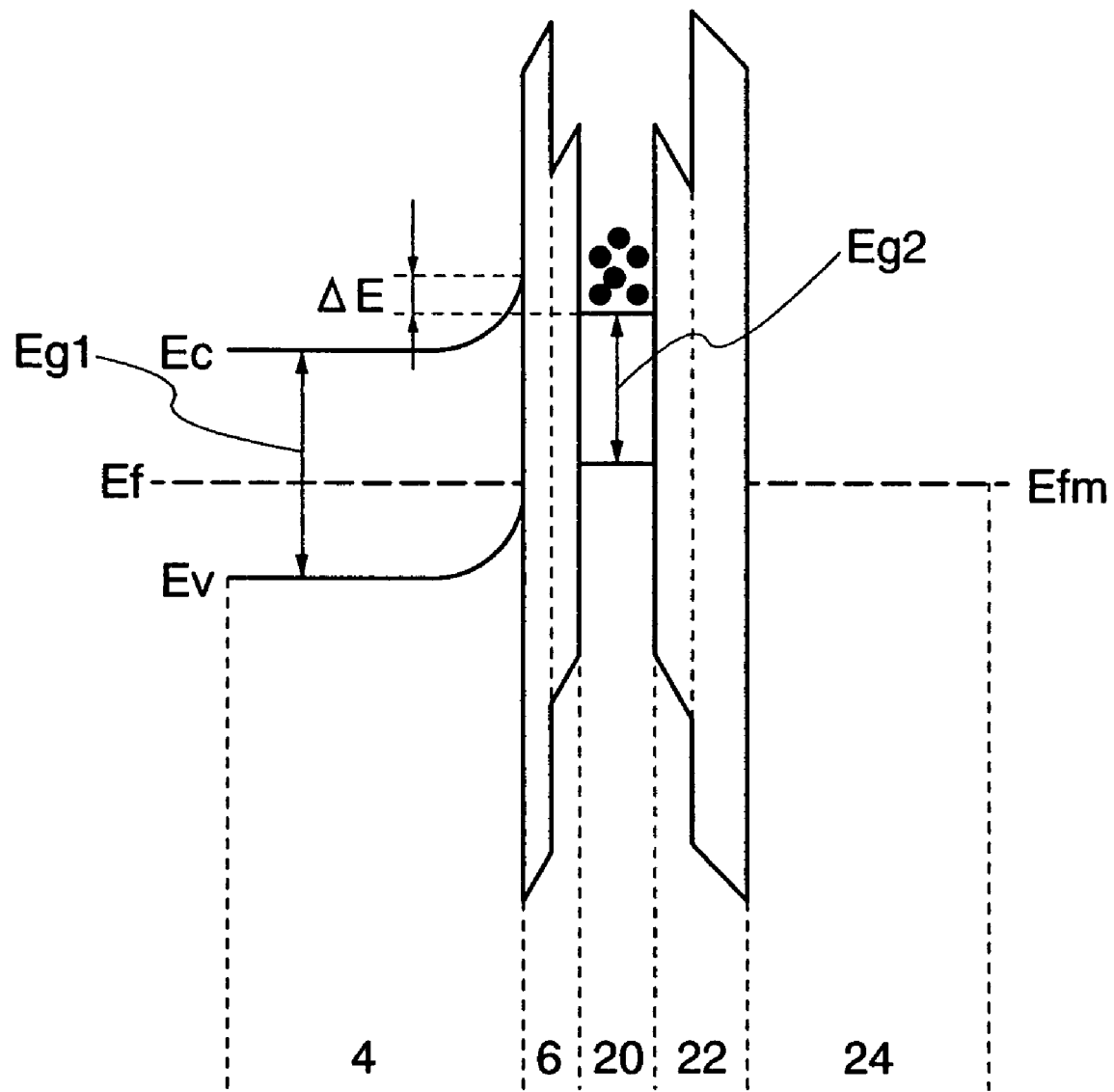
FIG. 18 is an energy band diagram of a charge retention state of a nonvolatile memory of Embodiment Mode 23 (Embodiment Mode 3).

FIG. 18 is an energy band diagram in a charge retention state (Eg1>Eg2). Carriers of the floating gate electrode 20 which are sandwiched between the first insulating layer 6 and the second insulating layer 22 are energetically trapped. Although the potential is increased by the carriers (electrons) accumulated in the floating gate electrode 20, the electrons are not discharged from the floating gate electrode 20 unless an energy which is higher than the barrier energy is provided for the electrons. That is, even when a reliability test is conducted by allowing the floating gate to stand at a constant temperature of 150° C., charges accumulated in the floating gate electrode can be held.

More specifically, it can be said that carriers of the first floating gate electrode layer 20a are energetically trapped. This state prevents the injected carriers from leaking to the second insulating layer 22 and being trapped at the interface of the second insulating layer 22 side. In other words, it can be prevented that in an erase operation, the carriers injected to the floating gate electrode 20 remain and erasing is performed defectively. It is needless to say that the second floating gate electrode layer 20b is also capable of accumulating carriers as a floating gate; therefore, it can function as a floating gate with the first floating gate electrode layer 20a compensated.

In any case, the electrons are not discharged from the floating gate electrode 20 unless an energy which is higher than the barrier energy is provided for the electrons. Further, since the bottom energy level of the conduction band of the floating gate electrode 20 is lower than the bottom energy level of the conduction band of the semiconductor film 4 by $\Delta E$ in terms of electron energy, an energy barrier with respect to electrons is formed. Due to this barrier, the electrons can be prevented from being discharged to the semiconductor film 4 by a tunneling current.

Figure 19:
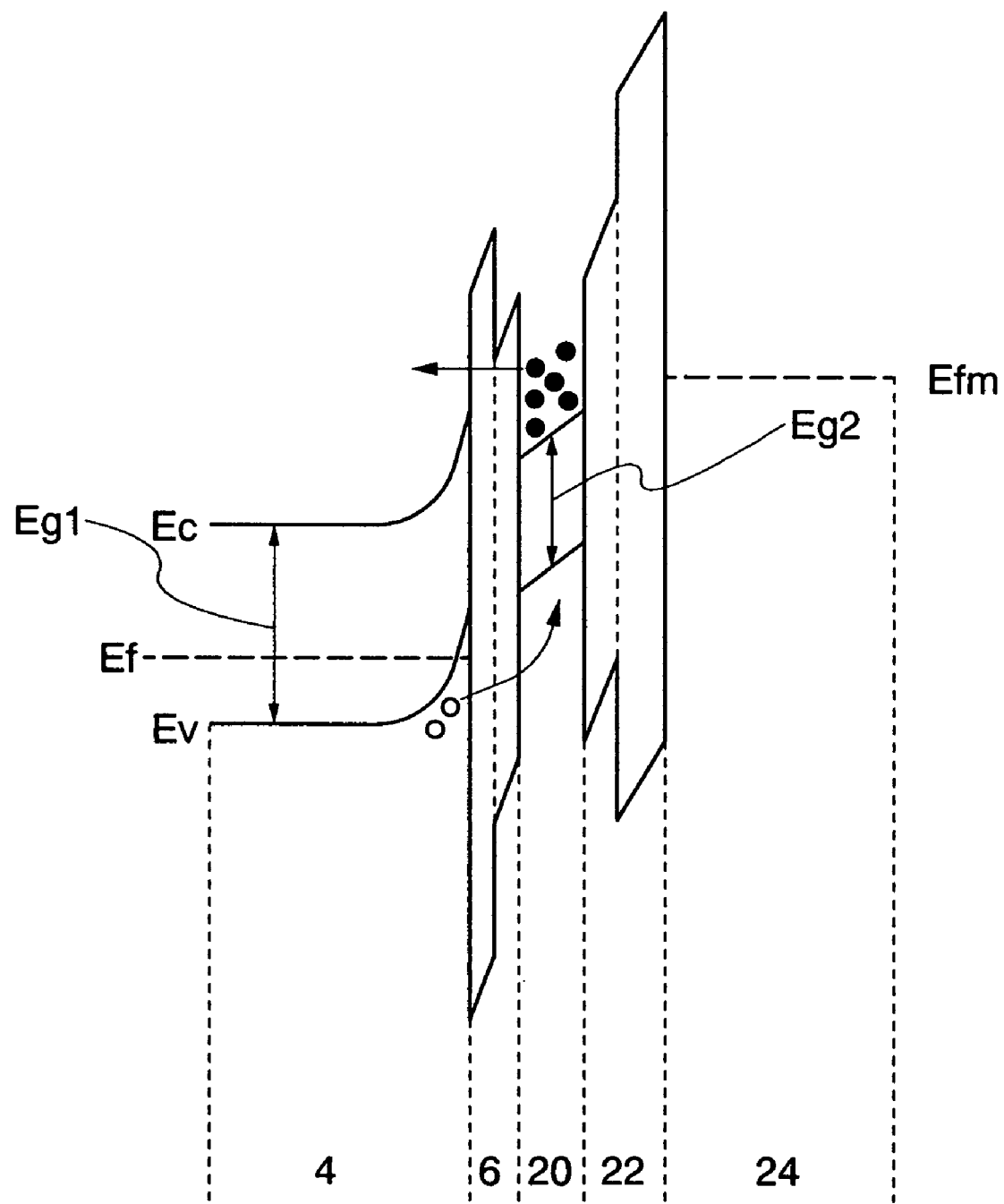
FIG. 19 is an energy band diagram of an erase state of a nonvolatile memory of Embodiment Mode 24 (Embodiment Mode 3).

FIG. 19 is an energy band diagram of the erase state (see FIG. 4, Eg1>Eg2) described in Embodiment Mode 1. Since the first insulating layer 6 can be formed to be thin, electrons of the floating gate electrode 20 can be discharged toward the semiconductor film 4 side by the F-N tunneling current in an erasing operation. In addition, holes are injected more easily from the channel formation region of the semiconductor substrate 1, and by injection of the holes into the floating gate electrode 20, a substantial erasing operation can be performed.

The first floating gate electrode layer 20a of the floating gate electrode 20 is formed by using germanium or a germanium compound, so that the first insulating layer 6 can be made thin. Consequently, it becomes easy to inject electrons into the floating gate electrode 20 by a tunneling current through the first insulating layer 6, which enables an operation at a low voltage. Further, charges can be held at a low energy level, so that such a significant effect that charges can be held at a stable state can be obtained.

As shown in FIGS. 15 and 17, the nonvolatile memory element of this embodiment mode has a structure in which Eg1>Eg2 is satisfied between the semiconductor film 4 and the floating gate electrode 20 so that a self-bias is generated. This relationship is extremely important and acts so that carriers are easily injected from the channel formation region of the semiconductor layer into the floating gate electrode. That is, the write voltage can be reduced. On the contrary, it is made difficult to discharge carriers from the floating gate electrode. This acts so that the memory retention characteristics of the nonvolatile memory element are improved. Further, a germanium layer as the floating gate electrode is doped with an n-type impurity so that the bottom energy level of conduction band thereof can be further lowered, whereby the self-bias can be made to act so as to further easily inject carriers into the floating gate electrode. That is, the write voltage can be reduced and the memory retention characteristics of the nonvolatile memory element can be improved.

As described above, in the nonvolatile memory element of this embodiment mode, charges can be injected easily from the semiconductor layer into the floating gate electrode and charges can be prevented from being discharged from the floating gate electrode. That is, in the case where it operates as a memory, highly efficient writing at a low voltage can be performed and charge retention characteristics can be improved.

Embodiment Mode 4

In this embodiment mode, description is made of a manufacturing method of an SOI type NAND cell with reference to FIGS. 20A to 20E. Note that although only a NAND cell is shown in the drawings, a transistor of a peripheral circuit is also formed over the same substrate as the NAND cell. The transistor of the peripheral circuit is formed in the same manner as a selection transistor of the NAND cell. A structure of the NAND cell described in this embodiment mode is shown in FIGS. 7 to 8C.

First, island-shaped semiconductor films 403 to 405 are formed over a substrate 400 with a base insulating film 401 interposed therebetween. The semiconductor films 403 and 405 form the selection transistors S1 and S2, respectively. The semiconductor film 404 forms the NAND cell.

Then, a low concentration impurity region forming a diode (not shown) is formed in the semiconductor film 404 (see FIGS. 8A to 8C). In order to form the low concentration impurity region, a region to which an impurity is not to be added is covered with a resist, and an impurity is selectively added to the semiconductor film 404.

First insulating films 406 to 408 are formed so as to cover the island-shaped semiconductor films 403 to 405, respectively. Then, a conductive film 409 forming a floating gate of a nonvolatile memory element to be completed later is formed so as to cover the first insulating films 406 to 408 (see FIG. 20A).

The island-shaped semiconductor films 403 to 405 can be provided in such a way that an amorphous semiconductor film is formed of a material containing silicon (Si) as its main component (for example, $Si_xGe_{1-x}$ or the like) by a sputtering method, an LPCVD method, a plasma CVD method or the like over the substrate 400; the amorphous semiconductor film is crystallized; and then the crystallized amorphous semiconductor film is selectively etched. It is to be noted that the amorphous semiconductor film can be crystallized by a laser crystallization method, a thermal crystallization method using RTA or an annealing furnace, a thermal crystallization method using a metal element promoting crystallization, a combination of them or the like.

When the crystallization or the recrystallization of a semiconductor film is conducted by laser irradiation, an LD-pumped continuous wave (CW) laser ($YVO_4$, second harmonic (wavelength: 532 nm)) can be used as a laser light source. The wavelength is not necessarily limited to the second harmonic; however, the second harmonic is superior to other higher harmonics in point of energy efficiency. When a semiconductor film is irradiated with CW laser light, the semiconductor film continuously receives energy; therefore, once the semiconductor film is melted, the melted state can continue. Moreover, it is possible to move a solid-liquid interface of the semiconductor film by scanning CW laser light and to form a crystal grain which is elongated in one direction along this moving direction.

A solid-state laser is used because its output is so stable that a stable treatment can be expected as compared with a gas laser or the like. Not only a CW laser but also a pulsed laser with a repetition rate of 10 MHz or more can be used. In a case of using a pulsed laser with high repetition rate, when the pulse interval is shorter than the period after the semiconductor film is melted and before the melted semiconductor film is solidified, the semiconductor film can constantly maintain a melted state. Then, the solid-liquid interface is moved so that the semiconductor film including a crystal grain which is elongated in one direction can be formed.

Another CW laser or pulsed laser with a repetition rate of 10 MHz or more may be used. For example, as the gas laser, an Ar laser, a Kr laser, a $CO_2$ laser or the like is given. As the solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser or the like is given. Moreover, a ceramic laser such as a YAG laser, a $Y_2O_3$ laser, a $GdVO_4$ laser, or a $YVO_4$ laser is given. As a metal vapor laser, a helium-cadmium laser or the like is given. Moreover, oscillation of laser light with $TEM_{00}$ (single transverse mode) in a laser oscillator is preferable because the energy homogeneity of a linear beam spot on an irradiation surface can be raised. Alternatively, a pulsed excimer laser may be used.

As the substrate 400, a glass substrate, a quartz substrate, a metal substrate (such as a stainless steel substrate), a ceramic substrate, or a semiconductor substrate such as a Si substrate can be used. Alternatively, as a plastic substrate, a substrate formed of polyethylene terephthalate (PET), polyethylene naphthalate (PEN), polyether sulfone (PES), acrylic, or the like can be used.

The base insulating film 401 is formed of an insulating material such as silicon oxide, silicon nitride, silicon oxynitride ($SiO_xN_y$, x>y>0) or silicon nitride oxide ($SiN_xO_y$, x>y>0), by a CVD method, a sputtering method or the like. For example, in a case where the base insulating film 401 has a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. By formation of the base insulating film 401 functioning as a blocking layer in this manner, it is possible to prevent alkaline earth metal or alkali metal such as Na in the substrate 400 from adversely affecting an element to be formed over the base insulating film 401. Note that in a case of using quartz for the substrate 400, the base insulating film 401 may be omitted.

Thermal treatment, plasma treatment or the like is performed on the semiconductor films 403 to 405 to form the first insulating films 406 to 408. For example, oxidation treatment, nitridation treatment or oxynitridation treatment is performed on the semiconductor films 403 to 405 by high-density plasma treatment, thereby forming the first insulating films 406 to 408 which becomes an oxide film, a nitride film, or a oxinitride film over the semiconductor films 403 to 405. Note that the first insulating films 406 to 408 may be formed by a plasma CVD method or a sputtering method.

In a case of performing oxidation treatment or nitridation treatment by high density plasma treatment with the use of the semiconductor films 403 to 405 each contain silicon as its main component, a silicon oxide ($SiO_x$) film or a silicon nitride $SiN_x$) film is formed as each of the first insulating films 406 to 408.

After performing oxidation treatment on the semiconductor films 403 to 405 by high-density plasma treatment, nitridation treatment may be performed by conducting high-density plasma treatment again. In that case, silicon oxide films are formed in contact with the semiconductor films 403 to 405 and films containing oxygen and nitrogen (hereinafter referred to as "silicon oxinitride film") are formed over the silicon oxide films, thereby forming stacks of the silicon oxide films and the films containing oxygen and nitrogen as the first insulating films 406 to 408.

Here, the first insulating films 406 to 408 are formed to have a thickness of 1 to 10 nm, preferably 1 to 5 nm. For example, after oxidation treatment is performed on the semiconductor films 403 to 405 by high-density plasma treatment to form silicon oxide films with a thickness of about 5 nm on surfaces of the semiconductor films 403 to 405, nitridation treatment is performed by high-density plasma treatment to form nitrogen plasma treatment layers on the surface or in the vicinity of the surface of the silicon oxide layers.

Specifically, first, a silicon oxide layer is formed to have a thickness of 3 nm to 6 nm by plasma treatment in an oxygen atmosphere over a semiconductor film. Subsequently, plasma treatment is performed in a nitrogen atmosphere to form the nitrogen plasma treatment layer with high nitrogen concentration on the surface or in the vicinity of the surface of the silicon oxide layer. Here, an example where nitrogen is contained at 20 to 50 atomic % in a depth of approximately 1 nm from the surface of the silicon oxide layer is employed. For the nitrogen plasma treatment layer, silicon containing oxygen and nitrogen (silicon oxynitride) is formed. Moreover, at this time, the oxidation treatment and the nitridation treatment by high-density plasma treatment are preferably performed continuously without exposure to the air. Thus, contaminant can be prevented from being mixed and production efficiency can be improved.

The oxidization of the semiconductor films by high-density plasma treatment is performed in an oxygen atmosphere (for example, in an atmosphere containing oxygen ($O_2$) or dinitrogen monoxide ($N_2O$) and a rare gas (containing at least one of He, Ne, Ar, Kr and Xe) or in an atmosphere containing oxygen or dinitrogen monoxide, hydrogen ($H_2$) and a rare gas). On the other hand, the nitridation of the semiconductor films by high-density plasma treatment is performed in a nitrogen atmosphere (for example, in an atmosphere containing nitrogen ($N_2$) and a rare gas (containing at least one of He, Ne, Ar, Kr and Xe), in an atmosphere containing nitrogen, hydrogen and a rare gas, or in an atmosphere containing $NH_3$ and a rare gas).

As the rare gas, for example, Ar can be used. Alternatively, a gas in which Ar and Kr are mixed may be used. In a case of performing high-density plasma treatment in a rare gas atmosphere, the first insulating films 406 to 408 may include the rare gas (containing at least one of He, Ne, Ar, Kr and Xe) used for the plasma treatment. When Ar is used, the first insulating films 406 to 408 may contain Ar.

Moreover, the high-density plasma treatment is performed in an atmosphere including the aforementioned gas with an electron density of $1 \times 10^{11}$ cm$^{-3}$ or more and a plasma electron temperature of 1.5 eV or less. More specifically, the electron density ranges from $1 \times 10^{11}$ cm$^{-3}$ to $1 \times 10^{13}$ cm$^{-3}$ and the plasma electron temperature ranges from 0.5 eV to 1.5 eV. Since the plasma electron density is high and the electron temperature in the vicinity of an object to be treated that is formed over the substrate 400 (here, the semiconductor films 403 to 405) is low, plasma damage on the object to be processed can be prevented.

Moreover, since the plasma electron density is as high as $1 \times 10^{11}$ cm$^{-3}$ or more, an oxide film or a nitride film formed by oxidizing or nitriding the object to be processed by using the plasma treatment can be dense and superior in uniformity of its film thickness and the like as compared to a film formed by a CVD method, a sputtering method or the like. Furthermore, since the plasma electron temperature is as low as 1.5 eV or less, oxidation treatment or nitridation treatment can be performed at lower temperature than in conventional plasma treatment or thermal oxidation method. For example, even by plasma treatment at temperatures lower than the distortion point of a glass substrate by 100° C. or more, oxidation treatment or nitridation treatment can be performed. As the frequency for forming plasma, high frequency such as a microwave (for example, 2.45 GHz) can be used.

In this embodiment mode, when oxidation treatment is performed on the object to be processed by high-density plasma treatment, a mixed gas of oxygen ($O_2$), hydrogen ($H_2$) and argon (Ar) is introduced. As a mixed gas used here, 0.1 to 100 sccm of oxygen, 0.1 to 100 sccm of hydrogen, and 100 to 5000 sccm of argon may be introduced. The mixed gas is preferably introduced at a ratio of 1:1:100=oxygen:hydrogen:argon. For example, 5 sccm of oxygen, 5 sccm of hydrogen, and 500 sccm of argon may be introduced.

In addition, when nitridation treatment is performed by high-density plasma treatment, a mixed gas of nitrogen ($N_2$) and argon (Ar) is introduced. As a mixed gas used here, 20 to 2000 sccm of nitrogen and 100 to 10000 sccm of argon may be introduced. For example, 200 sccm of nitrogen and 1000 sccm of argon may be introduced.

In this embodiment mode, the first insulating film 407 formed over the semiconductor film 404 in the memory portion functions as a tunnel oxide film in a nonvolatile memory element to be completed later. Therefore, the thinner the first insulating film 407 is, the more easily the tunneling current flows, which allows a higher-speed operation as a memory.

Further, when the first insulating film 407 is thinner, charges can be accumulated at lower voltage in a floating gate to be formed later; therefore, the power consumption of the semiconductor device can be reduced. Accordingly, the first insulating films 406 to 408 are preferably formed thin.

A thermal oxidation method is given as a method for forming a thin insulating film over a semiconductor film. However, in a case of using a substrate of which melting point is not sufficiently high, such as a glass substrate, it is very difficult to form the first insulating films 406 to 408 by a thermal oxidation method. Moreover, an insulating film formed by a CVD method or a sputtering method does not have sufficient film quality because of a defect inside the film, which causes a problem in that a defect such as a pinhole is produced when the film is formed to be thin. In addition, an insulating film formed by a CVD method or a sputtering method does not cover an end portion of the semiconductor film sufficiently; therefore, a conductive film and the like to be formed later over the insulating film 407 and the semiconductor film may cause leakage.

Thus, when the first insulating films 406 to 408 are formed by the high-density plasma treatment as described in this embodiment mode, they can be denser than an insulating layer formed by a CVD method, a sputtering method or the like. Moreover, the first insulating films 406 to 408 can sufficiently cover the end portions of the semiconductor films 403 to 405, respectively. As a result, operation speed and charge retention characteristics as a memory can be improved. It is to be noted that when the first insulating films 406 to 408 are formed by a CVD method or a sputtering method, preferably, high-density plasma treatment is performed after the insulating films are formed, whereby the surfaces of the insulating films are subjected to oxidation treatment, nitridation treatment, or oxynitridation treatment.

The conductive film 409 has a stacked-layer structure. First, a film formed from a material containing germanium such as germanium (Ge) or a silicon germanium alloy is formed. For example, as the conductive film 409, a film containing germanium as its component can be formed with a thickness of 1 to 20 nm, preferably 1 to 10 nm, in an atmosphere including a germanium element (for example, $GeH_4$) by a plasma CVD method. Further, for example, a germanium gas ($GeH_4$) attenuated by 5% to 10% with hydrogen is used; a heating temperature of the substrate 400 is at 200 to 350° C.; and high frequency power of 13.56 MHz to 60 MHz (for example, 27 MHz) is applied, whereby a germanium layer can be formed.

Further, a film is formed of a metal, an alloy thereof or a metal compound over the film formed from a material containing germanium. For example, a tantalum film is formed to have a thickness of 1 to 20 nm, preferably 1 to 10 nm. Alternatively, a high melting point metal such as tungsten (W), titanium (Ti), molybdenum (Mo), chromium (Cr) or nickel (Ni) may be used. As a material forming an alloy with the high melting point metal, niobium, zirconium, cerium, thorium or hafnium may be used. Alternatively, oxide or nitride of the high melting point metal may be used. As the metal nitride, tantalum nitride, tungsten nitride, molybdenum nitride, titanium nitride or the like can be used. As the metal oxide, tantalum oxide, titanium oxide, molybdenum oxide or the like can be used. An upper layer of the conductive film 409 can be formed by a sputtering method, an electron beam evaporation method or the like. In the case of using a sputtering method, a target including a metal which is an object may be used. Meanwhile, in the case of forming a metal oxide or a metal nitride, film formation is performed using reactive sputtering or a target including the metal oxide or the metal nitride.

An upper layer of the floating gate electrode (corresponding to the second floating gate electrode layer 20b in FIG. 13) is formed of a metal or the like, so that a lower layer of the floating gate electrode (corresponding to the first floating gate electrode layer 20a in FIG. 13) can be stabilized.

Subsequently, the first insulating films 406 and 408 and the conductive film 409 formed over the semiconductor films 403 and 405 are selectively removed, whereas the first insulating film 407 and the conductive film 409 formed over the semiconductor film 404 are left. Here, the semiconductor film 404, the first insulating film 407 and the conductive film 409 provided in the memory portion are selectively covered with a resist, and the first insulating films 406 and 408, and the conductive film 409 formed over the semiconductor films 403 and 405 are selectively removed by being etched (see FIG. 20B).

Further, another resist mask is formed and the conductive film 409 is selectively removed by etching, so that a floating gate electrode 411 is formed. A second insulating film 412 is formed so as to cover the semiconductor films 403 and 405, and the floating gate electrode 411 formed over the semiconductor film 404 (see FIG. 20C).

The second insulating film 412 is formed by a CVD method, a sputtering method or the like using an insulating material such as silicon oxide, silicon nitride, silicon oxynitride ($SiO_xN_y$, (x>y>0)), or silicon nitride oxide ($SiN_xO_y$, (x>y>0)) with a single layer structure or a stacked structure. For example, in the case of the second insulating film 412 with a single layer structure, a silicon oxynitride film or a silicon nitride oxide film is formed by a CVD method with a thickness of 5 nm to 50 nm. In addition, in the case of the second insulating film 412 with a three-layer structure, a silicon oxynitride film may be formed as a first insulating film, a silicon nitride film may be formed as a second insulating film, and a silicon oxynitride film may be formed as a third insulating film. Alternatively, an oxide or a nitride of germanium may be used as the second insulating film 412.

It is to be noted that the second insulating film 412 formed over the semiconductor film 404 functions as a control insulating film in a nonvolatile memory element to be completed later, and the second insulating film 412 formed over the semiconductor films 403 and 405 functions as a gate insulating film of a selection transistor to be completed later.

Next, the conductive film to be a control gate electrode of a NAND cell or a gate electrode of a selection transistor is formed to have a single-layer structure or a stacked structure. The conductive film can be formed using an element selected from tantalum (Ta), tungsten (W), titanium (Ti), molybdenum (Mo), aluminum (Al), copper (Cu), chromium (Cr), niobium (Nb) and the like, or an alloy material or a compound material containing the above element as its main component. Alternatively, a metal nitride film obtained by nitridation of these elements may be used. Further alternatively, a semiconductor material typified by polycrystalline silicon doped with an impurity element such as phosphorus may be used.

Here, a conductive film having a two-layer stacked structure is provided, in which the conductive films are formed using tantalum nitride and tungsten. Further, a single layer or stacked layers using tungsten nitride, molybdenum nitride or titanium nitride can be used as a lower conductive film, and a single layer or stacked layers using tantalum, molybdenum or titanium can be used as an upper conductive film.

Subsequently, the conductive films are selectively removed by etching, and thus a control gate electrode 413 which is integrally formed with a word line is formed in the NAND cell. Gate electrodes 414 and 415 which are integrally formed with the selection gate lines SG1 and SG2 are formed over the semiconductor films 403 and 405 respectively. Further, a source line 416 and an erasing line 417 are formed over the base insulating film 401.

Figure 20A:
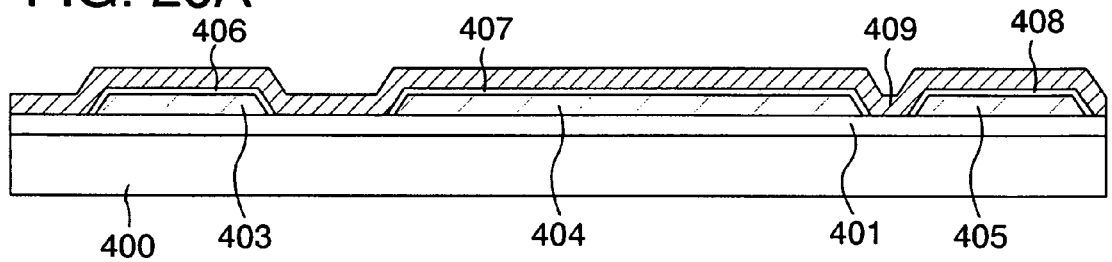
FIGS. 20A to 20E are cross sectional views showing a manufacturing process of a NAND memory cell (Embodiment Mode 4).
Figure 20B:
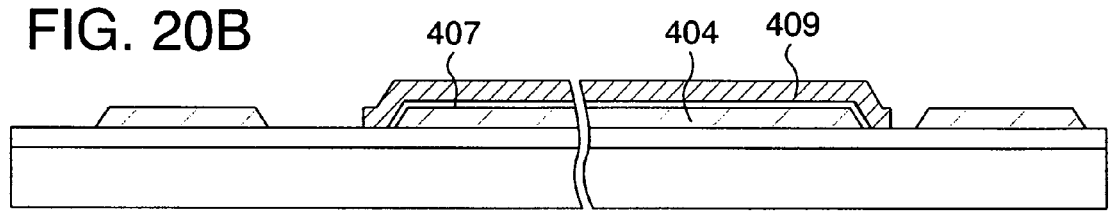
Figure 20C:
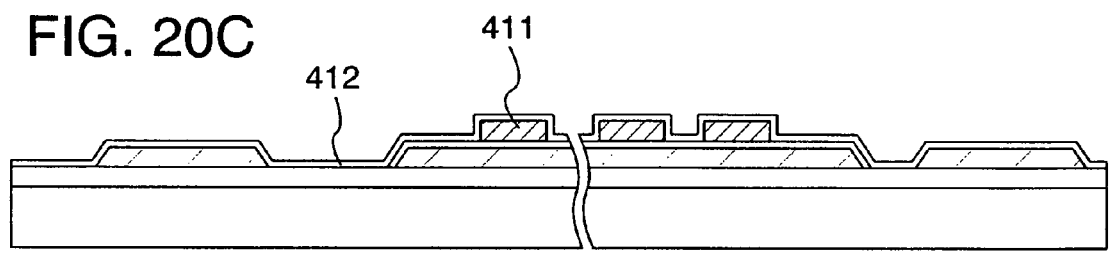
Figure 20D:
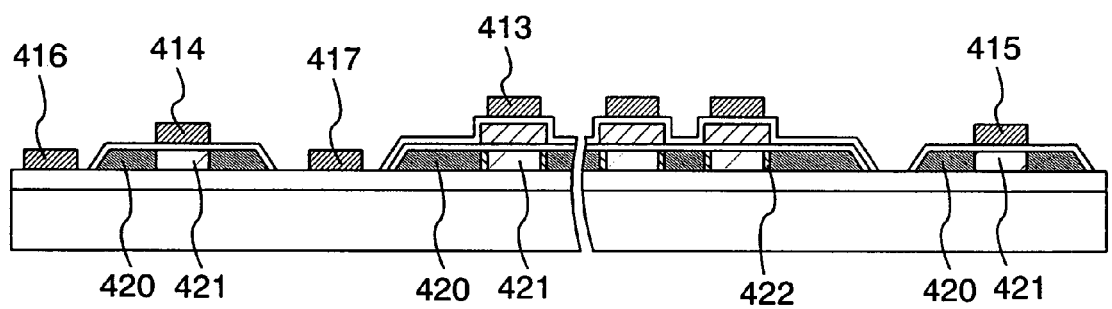

Next, a resist is selectively formed, and an impurity element is introduced to the semiconductor films 403 to 405 using the resist as masks, whereby an impurity region and a channel formation region imparting a desired conductivity type is formed (see FIG. 20D).

As the impurity element, an impurity element imparting n-type conductivity or an impurity element imparting p-type is used. As the impurity element imparting n-type, phosphorus (P), arsenic (As) or the like can be used. As the impurity element imparting p-type, boron (B), aluminum (Al), gallium (Ga) or the like can be used. Here, as the impurity element, phosphorus (P) is used. Formation of a resist and introduction of an impurity element are appropriately repeated, whereby an n-channel transistor and a p-channel transistor can be formed together over the substrate 400.

By introduction of the impurity element, a high-concentration impurity region 420 which forms a source or drain region and a channel formation region 421 are formed in each of the semiconductor films 403 and 405. Further, in the semiconductor film 404, the high concentration impurity region 420 which forms a source or drain region, a low concentration impurity region 422 which forms an LDD region, and the channel formation region 421 are formed.

The introduced impurity element passes through the floating gate electrode 411, whereby the low-concentration impurity region 422 is formed in the semiconductor film 404. Therefore, in the semiconductor film 404, the channel formation region 421 is formed in a region in which the floating gate electrode 411 and the control gate electrode 413 overlap with each other, and the low concentration impurity region 422 is formed in a region which overlaps with the floating gate electrode 411 and which does not overlap with the control gate electrode 413.

Figure 20E:
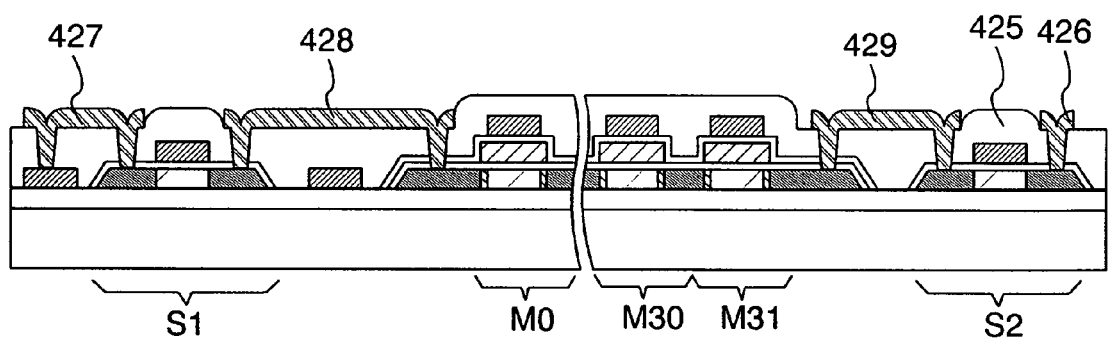

Next, an insulating film 425 is formed. A conductive film is formed over the insulating film 425 and the conductive film is etched using a resist, and thus an electrode and a wiring are formed. A reference numeral 426 denotes a bit line, and 427 denotes an electrode for connecting the selection transistor S1 and the source line 416. 428 and 429 denote electrodes for connecting the NAND cells to the selection transistors S1 and S2. In addition, although not shown, an electrode for connecting the erasing line 417 and the low concentration impurity region to be a diode, which is formed in the semiconductor film 404 (FIG. 20E).

The insulating film 425 can be provided with a single-layer structure of an insulating film containing oxygen or nitrogen such as a silicon oxide ($SiO_x$) film, a silicon nitride ($SiN_x$) film, a silicon oxynitride ($SiO_xN_y$, x>y) film or a silicon nitride oxide ($SiN_xO_y$, x>y) film, a film containing carbon such as DLC (diamond like carbon), an organic material such as epoxy, polyimide, polyamide, polyvinyl phenol, benzocyclobutene or acrylic, or a siloxane material such as a siloxane resin; or a stacked structure thereof. Note that the siloxane material corresponds to a material having Si—O—Si bonds. Siloxane has a skeleton formed of a bond of silicon (Si) and oxygen (O). As a substituent, an organic group containing at least hydrogen (for example, an alkyl group or an aryl group) is used. Alternatively, a fluoro group may be used. Further alternatively, an organic group containing at least hydrogen and a fluoro group may be used as a substituent.

The conductive film for forming the electrodes and the wirings denoted by reference numerals 426 to 429 is formed with a single layer structure or a stacked-layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C) and silicon (Si), or an alloy material or a compound material including the above element as its main component, by a CVD method, a sputtering method or the like. An alloy material containing aluminum as its main component corresponds to a material which contains aluminum as its main component and also contains nickel, or an alloy material which contains aluminum as its main component and also contains nickel and one or both of carbon and silicon, for example. The conductive film preferably employs, for example, a stacked layer structure of a barrier film, an aluminum-silicon (Al—Si) film, and a barrier film, or a stacked layer structure of a barrier film, an aluminum-silicon (Al—Si) film, a titanium nitride (TiN) film, and a barrier film.

It is to be noted that a barrier film corresponds to a thin film formed using titanium, a nitride of titanium, molybdenum or a nitride of molybdenum. Aluminum and aluminum silicon, which have low resistance and are inexpensive, are optimal materials for forming the conductive film. In addition, provision of upper and lower barrier layers can prevent generation of a hillock of aluminum or aluminum silicon. Furthermore, when the barrier film is formed using titanium that is a highly-reducible element, even if a thin natural oxide film is formed over the crystalline semiconductor film, the natural oxide film is reduced so that preferable contact with the crystalline semiconductor film can be obtained.

Note that this embodiment mode can be implemented in combination with any of the other embodiment modes described in this specification.

Embodiment Mode 5

In this embodiment mode, description is hereinafter made of an application example of a semiconductor device which is provided with the aforementioned nonvolatile semiconductor memory device of the present invention and in which data can be inputted/outputted without contact, with reference to drawings. The semiconductor device in which data can be inputted/outputted without contact is also referred to as an RFID tag, an ID tag, an IC tag, an IC chip, an RF tag, a wireless tag, an electronic tag, or a wireless chip depending on the usage.

Figure 21A:
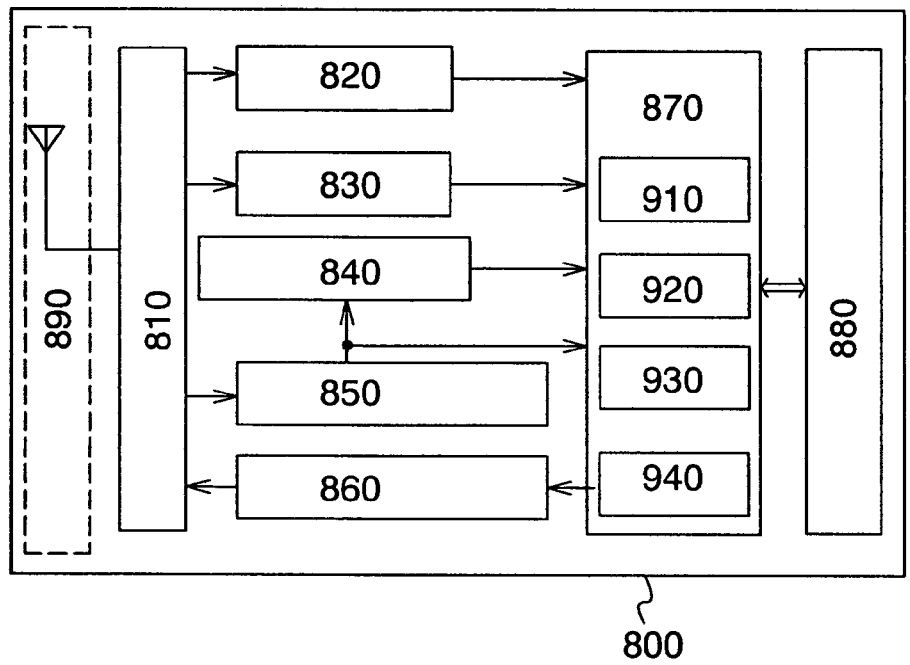
FIGS. 21A to 21C are views each showing an example of usage pattern of a semiconductor memory device of the present invention (Embodiment Mode 5).

The semiconductor device 800 has a function of exchanging data without contact, and includes a high frequency circuit 810, a power source circuit 820, a reset circuit 830, a clock generating circuit 840, a data demodulating circuit 850, a data modulating circuit 860, a control circuit 870 for controlling another circuit, a memory circuit 880, and an antenna 890 (FIG. 21A).

The high frequency circuit 810 receives a signal from the antenna 890 and outputs a signal, which is received from the data modulating circuit 860, to the antenna 890. The power source circuit 820 generates a power source potential from a received signal. The reset circuit 830 generates a reset signal. The clock generating circuit 840 generates various clock signals based on a received signal inputted from the antenna 890. The data demodulating circuit 850 demodulates a received signal and outputs the demodulated signal to the control circuit 870. The data modulating circuit 860 modulates a signal received from the control circuit 870. As the control circuit 870, for example, a code extracting circuit 910, a code determination circuit 920, a CRC determination circuit 930, and an output unit circuit 940 are provided. It is to be noted that the code extracting circuit 910 extracts each of a plurality of codes included in an instruction sent to the control circuit 870. The code determination circuit 920 determines the content of the instruction by comparing the extracted code with a code corresponding to a reference. The CRC determination circuit 930 detects whether there is a transmission error or the like based on the determined code.

Subsequently, an example of an operation of the aforementioned semiconductor device is described. First, a radio signal is received by the antenna 890 and then sent to the power source circuit 820 through the high frequency circuit 810, thereby generating a high power source potential (hereinafter referred to as VDD). The VDD is supplied to each circuit included in the semiconductor device 800. A signal sent to the data demodulating circuit 850 through the high frequency circuit 810 is demodulated (hereinafter this signal is called a demodulated signal). Moreover, signals transmitted through the reset circuit 830 and the clock generating circuit 840 through the high frequency circuit 810, and the demodulated signal are sent to the control circuit 870.

The signals sent to the control circuit 870 are analyzed by the code extracting circuit 910, the code determination circuit 920, the CRC determination circuit 930, and the like. Then, based on the analyzed signals, the information of the semiconductor device, which is stored in the memory circuit 880, is outputted. The outputted information of the semiconductor device is encoded in the output unit circuit 940. Further, the encoded information of the semiconductor device 800 passes through the data modulating circuit 860 and then is sent by the antenna 890 as a radio signal. It is to be noted that a low power source potential (hereinafter referred to as VSS) is common in the plurality of circuits included in the semiconductor device 800 and VSS can be set to GND. The nonvolatile semiconductor memory device of the present invention can be applied to the memory circuit 880. A driving voltage used for the nonvolatile semiconductor memory device of the present invention can be reduced; therefore the distance within which data can be exchanged without contact can be extended.

In this manner, when a signal is sent from a reader/writer to the semiconductor device 800 and the signal sent from the semiconductor device 800 is received by the reader/writer, the data in the semiconductor device can be read.

Moreover, in the semiconductor device 800, a power source voltage may be supplied to each circuit by an electromagnetic wave without a power source (battery), or a power source (battery) may be mounted so that a power supply voltage is supplied to each circuit by both an electromagnetic wave and the power source (battery).

Figure 21B:
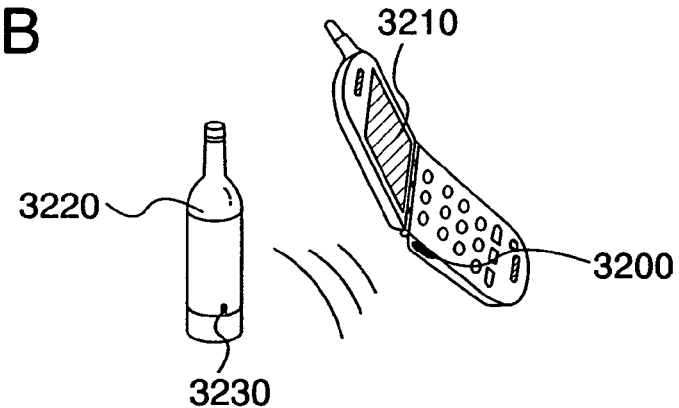

Next, an example of usage of a semiconductor device in which data can be inputted/outputted without contact is described. A side surface of a portable terminal including a display portion 3210 is provided with a reader/writer 3200. A side surface of a product 3220 is provided with a semiconductor device 3230 (FIG. 21B).

Figure 21C:
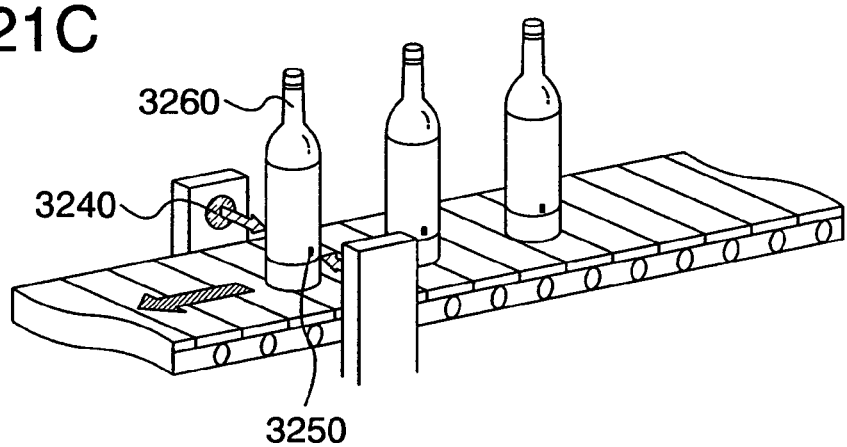

When the reader/writer 3200 is held over the semiconductor device 3230 included in the product 3220, the display portion 3210 displays information on the product, such as a raw material, a production area, an inspection result for each production step, history of circulation process, and description of the product. In addition, when a product 3260 is transferred by a conveyer belt, the product 3260 can be inspected by utilization of a semiconductor device 3250 provided for the product 3260 and a reader/writer 3240 (FIG. 21C). In this manner, by utilization of the semiconductor device in the system, information can be obtained easily and higher performance and higher added value are achieved.

Further, the nonvolatile semiconductor memory device of the present invention can be applied to electronic devices provided with a memory in various fields. For example, the nonvolatile semiconductor memory device of the present invention can be applied to electronic appliances: a camera such as a video camera or a digital camera, a goggle type display (a head-mounted display), a navigation system, an audio reproducing device (such as a car audio system or an audio component set), a computer, a game machine, a portable information terminal (such as a mobile computer, a mobile phone, a portable game machine or an electronic book), an image reproducing device provided with a recording medium (specifically, a device which reproduces a recording medium such as a DVD (Digital Versatile Disc) and has a display capable of displaying the reproduced image) and the like. FIGS. 22A to 22E specifically show examples of these electronic appliances.

Figure 22A:
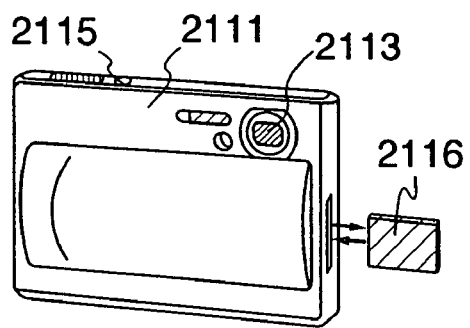
FIGS. 22A to 22E are views each showing an example of usage pattern of a semiconductor memory device of the present invention (Embodiment Mode 5).
Figure 22B:
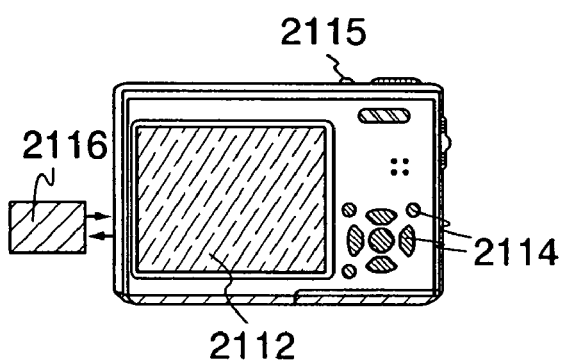

FIGS. 22A and 22B show a digital camera. FIG. 22B shows a rear side of the digital camera shown in FIG. 22A. This digital camera includes a housing 2111, a display portion 2112, a lens 2113, operation keys 2114, a shutter button 2115, and the like. Further, a nonvolatile memory 2116 which can be removed is provided, and shooting data of the digital camera is stored in the nonvolatile memory 2116. The nonvolatile semiconductor memory device formed using the present invention can be applied to the nonvolatile memory 2116.

Figure 22C:
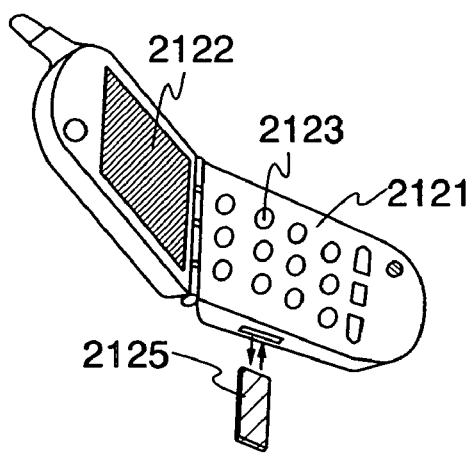

Further, FIG. 22C shows a mobile phone which is a typical example of the portable terminals. This mobile phone includes a housing 2121, a display portion 2122, operation keys 2123, and the like. Further, a nonvolatile memory 2125 which can be removed is provided in the mobile phone, and data such as a phone number of the mobile phone, image data, sound data, and the like can be stored in the nonvolatile memory 2125 and reproduced. The nonvolatile semiconductor memory device formed using the present invention can be applied to the memory 2125.

Figure 22D:
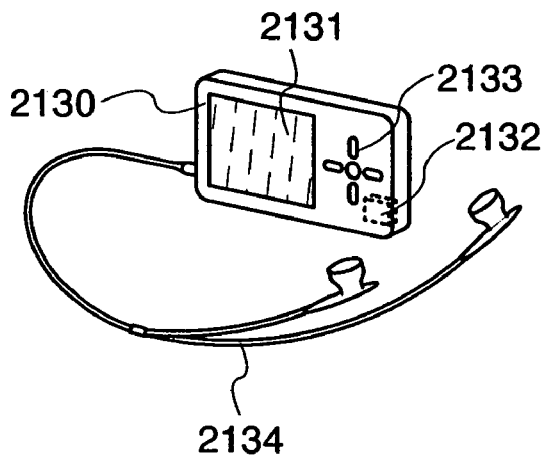

Further, FIG. 22D shows a digital player which is a typical example of the audio sets. The digital player shown in FIG. 22D includes a main body 2130, a display portion 2131, a memory portion 2132, an operation portion 2133, an earphone 2134 and the like. Note that a headphone or a wireless earphone can be used instead of the earphone 2134.

The nonvolatile semiconductor memory device formed using the present invention can be applied to the memory portion 2132. For example, the operation portion 2133 is operated with the use of a NAND type nonvolatile memory having a memory capacity of 20 to 200 gigabytes (GB), and thus an image or sound (music) can be recorded and reproduced. It is to be noted that power consumption of the display portion 2131 can be suppressed by displaying white characters on the black background. This is particularly effective in a portable audio set. The nonvolatile semiconductor memory device provided in the memory portion 2132 may be removable.

Figure 22E:
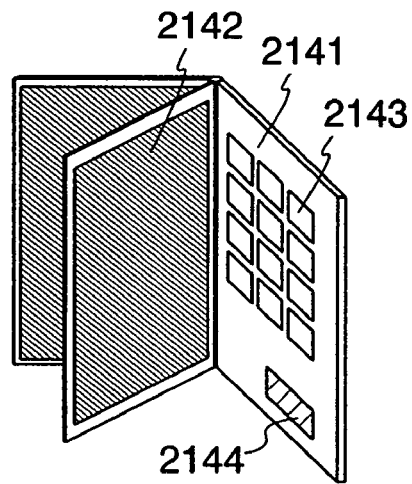

Further, FIG. 22E shows an electronic book (also referred to as electronic paper). This electronic book includes a main body 2141, a display portion 2142, operation keys 2143, and a memory portion 2144. In addition, a modem may be incorporated in the main body 2141, or data may be transmitted and received wirelessly. The nonvolatile semiconductor memory device formed using the present invention can be applied to the memory portion 2144.

For example, the operation keys 2143 are operated with the use of a NAND type nonvolatile memory having a memory capacity of 20 to 200 gigabytes (GB), and thus an image or sound (music) can be recorded and reproduced. The nonvolatile semiconductor memory device provided in the memory portion 2144 may be removable.

As described above, the applicable range of the semiconductor device provided with a nonvolatile semiconductor memory of the present invention is extremely wide and can be used for electronic devices in various fields as long as they have a memory.

This application is based on Japanese Patent Application serial no. 2006-101265 filed in Japan Patent Office on 31, Mar., 2006, the entire contents of which are hereby incorporated by reference.

What is claimed is:

1. A semiconductor device comprising:
   at least a cell including a plurality of memory elements electrically connected in series, wherein:
   each of the plurality of memory elements includes a channel formation region, source and drain regions, a floating gate, and a control gate,
   each of the source and drain regions is electrically connected to an erasing line through a semiconductor impurity region, and
   the source and drain regions are diode-connected to the erasing line.

2. The semiconductor device according to claim 1, wherein the cell is a NAND cell.

3. The semiconductor device according to claim 1, wherein the plurality of memory elements are provided over an insulating surface.

4. The semiconductor device according to claim 1, wherein the channel formation region and the source and drain regions of each of the plurality of memory elements included in the cell are formed in one semiconductor film.

5. The semiconductor device according to claim 1, wherein the channel formation region, the source and drain regions, and the semiconductor impurity region are included in one semiconductor film.

6. The semiconductor device according to claim 1, wherein the source and drain regions are in contact with the semiconductor impurity region.

7. The semiconductor device according to claim 1, wherein the source and drain regions and the semiconductor impurity region form a PN junction.

8. The semiconductor device according to claim 1, further comprises a first transistor and a second transistor which are electrically connected to the plurality of memory elements in series,
   wherein the control gate is electrically connected to a word line,
   wherein the plurality of memory elements are electrically connected to a source line through the first transistor, and
   wherein the plurality of memory elements are electrically connected to a bit line through the second transistor.

9. The semiconductor device according to claim 1, further comprises a first transistor and a second transistor which are electrically connected to the plurality of memory elements in series,
   wherein the control gate is electrically connected to a word line,
   wherein the plurality of memory elements are electrically connected to a source line through the first transistor,
   wherein the plurality of memory elements are electrically connected to a bit line through the second transistor, and
   wherein the plurality of memory elements, the first transistor, and the second transistor are provided over an insulating surface.

10. An electronic apparatus using the semiconductor device according to claim 1.

11. A semiconductor device comprising:
   at least a cell including a plurality of memory elements electrically connected in series,
   wherein:
   each of the plurality of memory elements includes a channel formation region, source and drain regions, a floating gate, and a control gate,
   each of the source and drain regions is electrically connected to an erasing line through a semiconductor impurity region,
   a conductivity type of the source and drain regions is different from that of the semiconductor impurity region, and the source and drain regions include an impurity element at a higher concentration than the semiconductor impurity region.

12. The semiconductor device according to claim 11, wherein the cell is a NAND cell.

13. The semiconductor device according to claim 11, wherein the plurality of memory elements are provided over an insulating surface.

14. The semiconductor device according to claim 11, wherein the channel formation region and the source and drain regions of each of the plurality of memory elements included in the cell are formed in one semiconductor film.

15. The semiconductor device according to claim 11, wherein the channel formation region, the source and drain regions, and the semiconductor impurity region are included in one semiconductor film.

16. The semiconductor device according to claim 11, wherein the source and drain regions are diode-connected to the erasing line.

17. The semiconductor device according to claim 11, wherein the source and drain regions are in contact with the semiconductor impurity region.

18. The semiconductor device according to claim 11, wherein the source and drain regions and the semiconductor impurity region form a PN junction.

19. The semiconductor device according to claim 11, further comprises a first transistor and a second transistor which are electrically connected to the plurality of memory elements in series,
wherein the control gate is electrically connected to a word line,
wherein the plurality of memory elements are electrically connected to a source line through the first transistor, and
wherein the plurality of memory elements are electrically connected to a bit line through the second transistor.

20. The semiconductor device according to claim 11, further comprises a first transistor and a second transistor which are electrically connected to the plurality of memory elements in series,
wherein the control gate is electrically connected to a word line,
wherein the plurality of memory elements are electrically connected to a source line through the first transistor,
wherein the plurality of memory elements are electrically connected to a bit line through the second transistor, and
wherein the plurality of memory elements, the first transistor, and the second transistor are provided over an insulating surface.

21. The semiconductor device according to claim 11, wherein the source and drain regions are disposed between the channel formation region and the semiconductor impurity region.

22. An electronic apparatus using the semiconductor device according to claim 11.

23. A semiconductor device comprising:
at least a cell including a plurality of memory elements electrically connected in series,
wherein:
each of the plurality of memory elements includes a channel formation region, source and drain regions, a floating gate, and a control gate,
each of the source and drain regions is electrically connected to an erasing line through a semiconductor impurity region,
a conductivity type of the source and drain regions is different from that of the semiconductor impurity region,
the source and drain regions include an impurity element at a higher concentration than the semiconductor impurity region,
the source and drain regions are electrically connected to the semiconductor impurity region through a region, and
the source and drain regions and the semiconductor impurity region include the impurity element at a higher concentration than the region.

24. The semiconductor device according to claim 23, wherein the cell is a NAND cell.

25. The semiconductor device according to claim 23, wherein the plurality of memory elements are provided over an insulating surface.

26. The semiconductor device according to claim 23, wherein the channel formation region and the source and drain regions of each of the plurality of memory elements included in the cell are formed in one semiconductor film.

27. The semiconductor device according to claim 23, wherein the channel formation region, the source and drain regions, and the semiconductor impurity region are included in one semiconductor film.

28. The semiconductor device according to claim 23, wherein the source and drain regions are diode-connected to the erasing line.

29. The semiconductor device according to claim 23, wherein the source and drain regions are in contact with the semiconductor impurity region.

30. The semiconductor device according to claim 23, wherein the source and drain regions, the region, and the impurity semiconductor region form a PIN junction.

31. The semiconductor device according to claim 23, further comprises a first transistor and a second transistor which are electrically connected to the plurality of memory elements in series,
wherein the control gate is electrically connected to a word line,
wherein the plurality of memory elements are electrically connected to a source line through the first transistor, and
wherein the plurality of memory elements are electrically connected to a bit line through the second transistor.

32. The semiconductor device according to claim 23, further comprises a first transistor and a second transistor which are electrically connected to the plurality of memory elements in series,
wherein the control gate is electrically connected to a word line,
wherein the plurality of memory elements are electrically connected to a source line through the first transistor,
wherein the plurality of memory elements are electrically connected to a bit line through the second transistor, and
wherein the plurality of memory elements, the first transistor, and the second transistor are provided over an insulating surface.

33. The semiconductor device according to claim 23, wherein the source and drain regions are disposed between the channel formation region and the semiconductor impurity region.

34. An electronic apparatus using the semiconductor device according to claim 23.

* * * * *